United States Patent
Van Rees et al.

(10) Patent No.: US 12,021,348 B2
(45) Date of Patent: Jun. 25, 2024

(54) INTEGRATED-OPTICS-BASED EXTERNAL-CAVITY LASER CONFIGURED FOR MODE-HOP-FREE WAVELENGTH TUNING

(71) Applicant: LioniX International BV, Enschede (NL)

(72) Inventors: Albert Van Rees, Enschede (NL); Klaus Boller, Enschede (NL); Ruud Michiel Oldenbeuving, Enschede (NL); Dimitri Geskus, Enschede (NL)

(73) Assignee: LioniX International BV, Enschede (NL)

( * ) Notice: Subject to any disclaimer, the term of this patent is extended or adjusted under 35 U.S.C. 154(b) by 582 days.

(21) Appl. No.: 17/423,052

(22) PCT Filed: Jan. 14, 2020

(86) PCT No.: PCT/IB2020/050278
§ 371 (c)(1),
(2) Date: Jul. 14, 2021

(87) PCT Pub. No.: WO2020/148656
PCT Pub. Date: Jul. 23, 2020

(65) Prior Publication Data
US 2022/0131342 A1 Apr. 28, 2022

Related U.S. Application Data

(60) Provisional application No. 62/792,120, filed on Jan. 14, 2019.

(51) Int. Cl.
*H01S 5/065* (2006.01)
*H01S 5/068* (2006.01)
*H01S 5/10* (2021.01)

(52) U.S. Cl.
CPC ........ *H01S 5/0651* (2013.01); *H01S 5/06821* (2013.01); *H01S 5/1039* (2013.01)

(58) Field of Classification Search
CPC ........................... H01S 5/06821; H01S 5/0651
See application file for complete search history.

(56) References Cited

U.S. PATENT DOCUMENTS 7,142,317 B2 11/2006 Naito et al.
7,146,087 B2 12/2006 Heideman et al.
(Continued)

FOREIGN PATENT DOCUMENTS

| CN | 101604818 A | 12/2009 |
| CN | 108448379 A | 8/2018 |
| JP | 2004-356505 A | 12/2004 |

OTHER PUBLICATIONS

Albert van Rees et al., "Ring resonator enhanced mode-hop-free wavelength tuning of an integrated extended-cavity laser", "Optics Express", Feb. 13, 2020, pp. 5569-5683, vol. 28, No. 4, Optical Society of America, https://doi.org.10.1364/OE.386356.
(Continued)

Primary Examiner — Tuan N Nguyen
(74) Attorney, Agent, or Firm — Kaplan Breyer Schwarz, LLP

(57) ABSTRACT

Aspects of the present disclosure describe systems, methods and structures including an integrated-optics-based externa-cavity laser configured for mode-hop-free wavelength tuning having an increased continuous tuning range with an ultra-narrow linewidth by increasing tuning sensitivity. Ultra-narrow linewidth is provided by extending cavity length with a multi-pass resonator based filter that may advantageously include tunable microring resonators that enable single-mode oscillation while contributing to the optical length of the laser with multiple passes of light through the ring(s) per roundtrip in the laser cavity. Further
(Continued)

aspects of the present disclosure describe systems, methods, and structures exhibiting an enhanced "tuning sensitivity"—defined by a continuous wavelength shift per induced cavity phase shift by a phase section. Such tuning sensitivity is increased by approximately a factor of 3 for synchronous tuning of phase section and ring resonators as compared to tuning phase section only.

10 Claims, 17 Drawing Sheets

(56) References Cited

U.S. PATENT DOCUMENTS

| | | | |
|---|---|---|---|
| 9,020,317 | B2 | 4/2015 | Heideman et al. |
| 9,221,074 | B2 | 12/2015 | Heideman et al. |
| 9,453,791 | B2 | 9/2016 | Schreuder et al. |
| 9,653,882 | B1 * | 5/2017 | Zheng ............... H01S 5/142 |
| 9,764,352 | B2 | 9/2017 | Heideman et al. |
| 2009/0122817 | A1 | 5/2009 | Sato et al. |
| 2018/0203262 | A1 | 7/2018 | Leinse et al. |

OTHER PUBLICATIONS

Authorized Officer: Reichel, Stefan, International Search Report and Written Opinion issued in counterpart PCT application No. PCT/IB2020/050278, Jun. 4, 2020, 14 pp.

Bin Liu et al., "Passive microring-resonator-coupled lasers", "Applied Physics Letters", Nov. 26, 2001, American Institute of Physics, DOI: 10.1063/1.1420585, pp. 3561-3563, vol. 79, No. 22.

Tin Komljenovic et al., "Widely-Tunable Ring-Resonator Semiconductor Lasers", "Applied Sciences", Jul. 17, 2017, doi: 10.3390/app7070732, 21 pp.

Office Action issued in Korean patent application No. 10-2021-7025871, Mar. 24, 2023, 6 pp. w/ English translation.

Office Action issued in Chinese Patent Application No. 202080007935.6, Aug. 14, 2023, 10 pp. w/ translation.

* cited by examiner

INTEGRATED-OPTICS-BASED EXTERNAL-CAVITY LASER CONFIGURED FOR MODE-HOP-FREE WAVELENGTH TUNING

TECHNICAL FIELD

This disclosure relates to tunable lasers in general, and, more particularly, to integrated-optics-based tunable lasers.

BACKGROUND

Narrowband, wavelength-tunable lasers are of interest for many applications, which can be found in the fields of telecom, metrology and sensing. Examples are higher order modulation formats for coherent communication, atomic clocks, and Laser Doppler Vibrometers.

In many such applications, an ability to precisely tune the optical wavelength is required, for example, to set the laser to the desired wavelength, keep the wavelength of the laser at a desired wavelength via a servo control loop, and the like. Unfortunately, tuning a laser by changing its cavity length can induce undesirable mode hops between a plurality of cavity modes. Such mode-hops can result in wavelength jumps that are difficult, if not impossible, to correct using a servo control system. In addition, mode-hops slow down tuning speed. As a result, a narrowband mode-hop-free tunable laser is highly desirable.

Reducing the linewidth of a laser can also be done by increasing the cavity length; however, this will also decrease the spectral distance between the cavity modes of the laser, thereby increasing the likeliness of mode-hops during wavelength-tuning. Mode hopping can be mitigated, however, by placing an adjustable spectral filter inside the laser cavity and tuning it simultaneously with the cavity length. Such synchronous tuning has been demonstrated in both Littman-Metcalf and Littrow configurations, for example, by choosing the correct pivot point for a grating in an external-cavity laser. Alternatively, mode-hop-free tuning can be enabled for an external cavity laser by simultaneous rotation of a multilayered dielectric filter while extending the cavity length.

Unfortunately, these external-cavity lasers are quite sensitive to mechanical vibration and misalignment. As a result, synchronous tuning approaches have also been applied to fully integrated DBR/DFB lasers. In such approaches, synchronous tuning is realized by choosing a proper ratio between changing the Bragg current and the phase current. Unfortunately, such prior-art tunable lasers are characterized by large linewidths in the megahertz range.

Ring-resonator-coupled diode lasers have shown promise for enabling both wide tuning range and a narrow linewidth. Typically, the tuning range of such lasers covers the full gain bandwidth via the Vernier effect. By integrating a low-loss feedback circuit with a semiconductor optical amplifier, laser linewidth can be reduced to the 10-kHz range. Recently, a linewidth of 290 Hz has been reported. Unfortunately, even though these lasers can be tuned over a wide spectral range, a systematic approach to mode-hop-free tuning has not been demonstrated yet.

The need for an integrated-optics-based, mode-hop-free tunable laser having large tuning range remains, as yet, unmet in the prior art.

SUMMARY

An advance in the art is made according to aspects of the present disclosure directed to an integrated-optics-based tunable laser having a mode-hop-free tuning range greater than the free-spectral range of its laser cavity. Embodiments in accordance with the present disclosure employ simultaneous tuning of a phase section included in the laser cavity and one or more ring resonators that collectively define an external mirror for the laser cavity.

Like tunable lasers in the prior art, tunable lasers in accordance with the present disclosure employ a gain medium that is optically coupled with an integrated-optics-based optical circuit comprising a tunable ring-resonator mirror configuration. The gain medium includes one polished facet that acts as a first laser-cavity mirror, while the ring-resonator-mirror acts as the second laser-cavity mirror, thereby defining an external-cavity laser.

In sharp contrast to the prior-art, a tunable phase section is included within the laser cavity, where the phase section and the ring-resonator configuration are synchronously tuned with a proper ratio, thereby enabling a mode-hop-free tuning range of multiple times the cavity mode spacing.

Of particular advantage—and in further contrast to the prior art—systems, methods, and structures according to aspects of the present disclosure exhibit an increased "tuning sensitivity"—namely a continuous wavelength shift per induced cavity phase shift produced by a phase section. Such a distinguishing and surprisingly effective characteristic of systems, methods, and structures according to the present disclosure is particularly important as continuous tuning is shown to be possible with an intracavity phase shifter—such as those disclosed herein—and not by merely increasing cavity length of a laser.

As we shall show and describe further, systems, methods, and structures according to aspects of the present disclosure achieve superior tuning sensitivity as compared to the prior art by exploiting a resonator-based filter structure (including one or more ring resonators) as a tuning element which contributes to cavity length. As a result, according to aspects of the present disclosure, when a resonant wavelength of the ring resonators is/are tuned, the laser cavity length increases as well. Such tuning sensitivity is—for synchronous tuning—independent of the added cavity length provided by the ring resonators, and is given by the optical length of any bus and gain waveguides.

Those skilled in the art will readily appreciate that such operation according to aspects of the present disclosure is in sharp contrast to—for example—using gratings as a mechanism to increase cavity length—which have an effective length that is substantially the same order as the grating length.

An illustrative embodiment is an integrated-optics-based laser that includes a gain medium that is integrated, in hybrid fashion, with a substrate comprising a low-loss dielectric-waveguide-based optical circuit. The gain medium and optical circuit are arranged to form the laser cavity of the laser. The gain medium includes a first facet that is polished to define one mirror of the laser cavity, and a second facet that is optically coupled with an input port of the optical circuit. The low-loss dielectric waveguide circuit includes a pair of ring resonators that are optically coupled in a Vernier arrangement that defines a second mirror for the laser cavity. The optical circuit also includes a phase section that is located between the input port and ring-resonator mirror. By virtue of the inclusion of the optical circuit, the optical length of the laser cavity can be several centimeters or more, which enables a laser having an extremely narrow linewidth. For example, in the depicted example, the laser cavity has an optical length of several centimeters and a linewidth in the 10-kHz-range.

In some embodiments, the optical circuit is based on a waveguide structure having a multi-layer core comprising a pair of stoichiometric silicon nitride layers that are separated by a stoichiometric silicon dioxide layer, where the multi-layer core is configured such that it collectively supports a single optical mode.

In some embodiments, at least one of the phase section and a ring-resonator in the ring-resonator configuration is thermally tuned. In some embodiments, at least one of the phase section and a ring-resonator in the ring-resonator configuration is tuned via a stress-inducing phase controller

BRIEF DESCRIPTION OF THE DRAWING

A more complete understanding of the present disclosure may be realized by reference to the accompanying drawing in which:

FIG. 8(A) and FIG. 8(B) depicts plots of superimposed laser spectra in which: FIG. 8(A) shows the optical power in a 0.1 nm resolution bandwidth when the Vernier filter is tuned in steps of 5 nm, and measured laser power in a 0.01 nm resolution bandwidth; and FIG. 8(B) shows a high SMSR of 63 dB in which the spectrum shown is an average over 10 measurements to reduce background noise level and increase visibility of side nodes wherein the amplifier current is set to 300 mA;

FIG. 10(A) and FIG. 10(B) depicts plots of measured laser wavelength in which: FIG. 10(A) also shows output power; and FIG. 10(B) shows wavelength as a function of phase section heater power; also shown is synchronous tuning of the phase section with the Vernier filter, tuning only the phase section, and mode hops; according to aspects of the present disclosure.

Figure 1A:
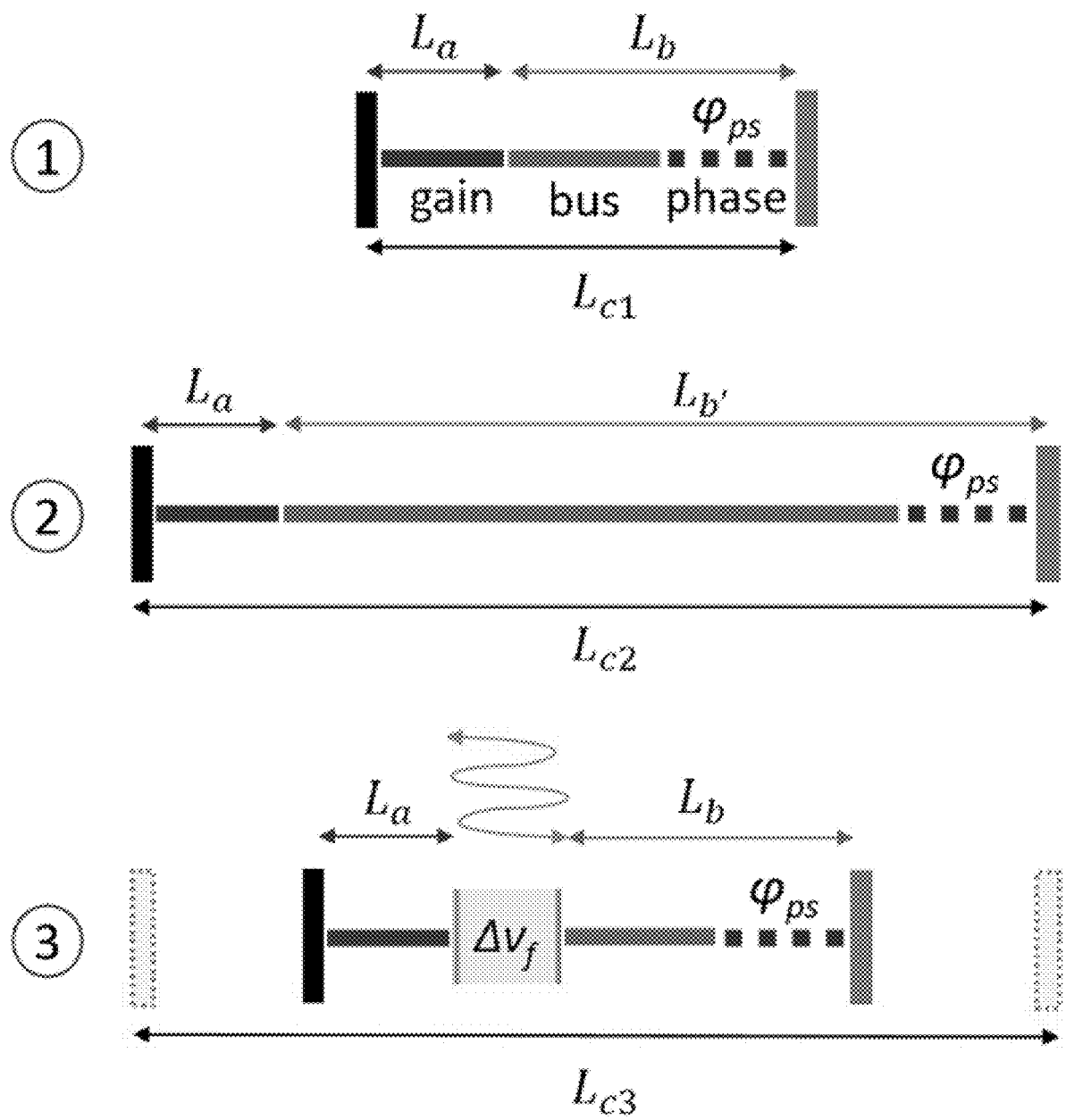
FIG. 1(A) depicts a schematic drawing of an illustrative embodiment of three lasers having the same optical amplifier section but with different cavity configurations.

The illustrative embodiments are described more fully by the figures and detailed description. Embodiments according to this disclosure may, however, be embodied in various forms and are not limited to specific or illustrative embodiments described in the drawing and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGs comprising the drawing are not drawn to scale.

Figure 1B:
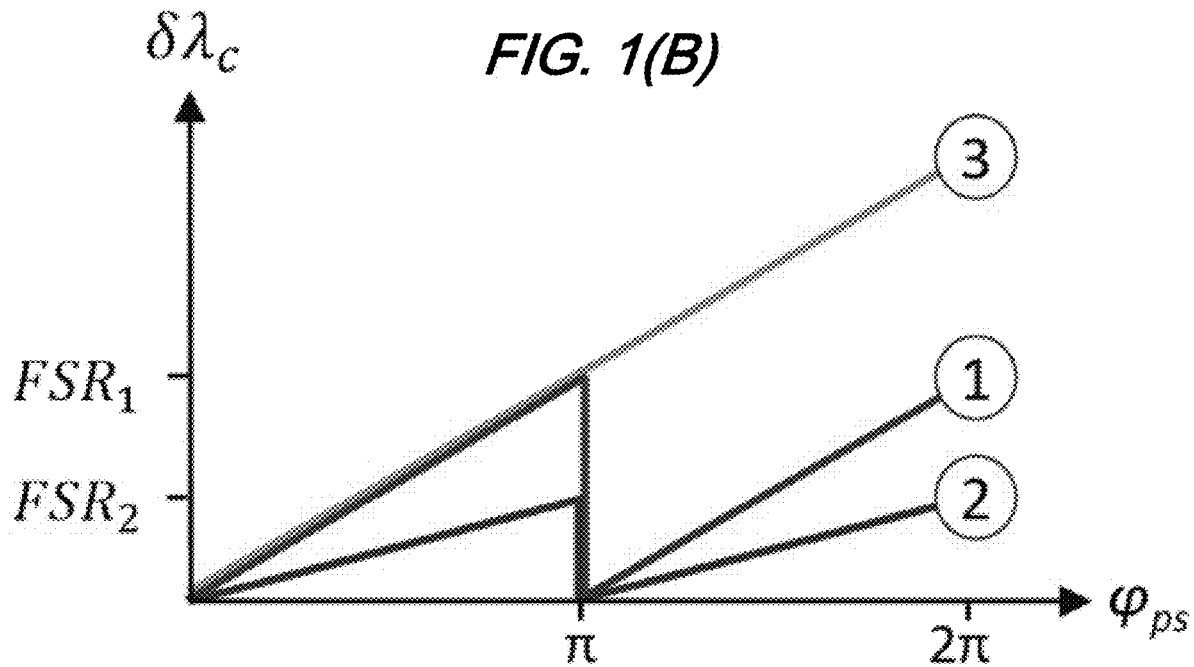
FIG. 1(B) depicts a plot illustrating the tuning behavior of the three lasers of FIG. 1(A)
Figure 1C:
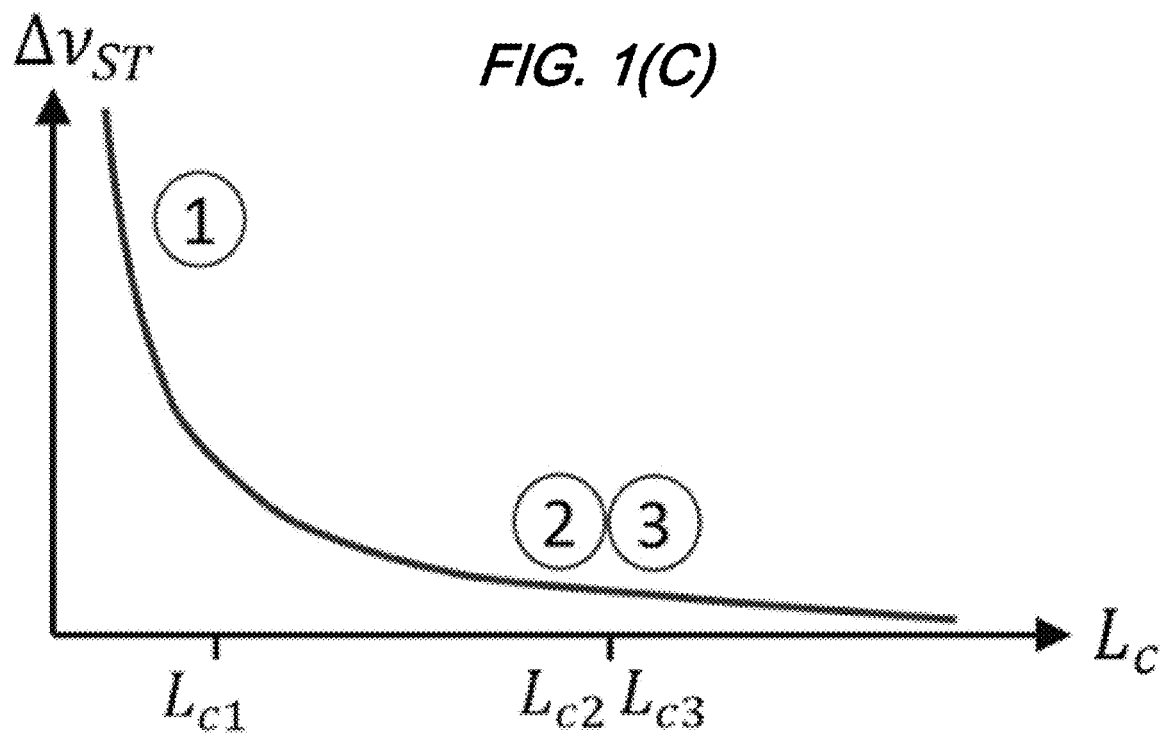
FIG. 1(C) depicts a plot illustrating the Schawlow-Townes linewidth of the three lasers of FIG. 1(A)

FIG. 1(A) depicts a schematic drawing of an illustrative embodiment of three lasers having the same optical amplifier section but with different cavity configurations according to aspects of the present disclosure. FIG. 1(B) depicts a plot illustrating the tuning behavior of the three lasers of FIG. 1(A), and FIG. 1(C) depicts a plot illustrating the Schawlow-Townes linewidth of the three lasers of FIG. 1(A). These illustrates the tuning and linewidth limitations of integrated lasers and our strategy to obtain a large tuning sensitivity $F_\lambda$ and at the same time maintain single-frequency oscillation with a narrow intrinsic linewidth.

Laser 1 illustratively shown in FIG. 1(A) is a schematic representation of a simple, fully integrated laser which includes a gain element of length $L_a$, and a bus section of length $L_b$ that includes a phase section. The total cavity length $L_{c1}=L_a+L_b$ may be small, and therefore the laser possesses a large tuning sensitivity $F_\lambda \propto 1/L_{c1}$. The corresponding laser cavity free-spectral range is large, enabling continuous tuning by the phase section over a range up to $FSR_1$, as is schematically shown in FIG. 1(B). Note that such configuration having a small cavity length results in a broad Schawlow-Townes linewidth, as is schematically shown in FIG. 1(C).

To obtain a small Schawlow-Townes linewidth, the bus waveguide can be extended to a length $L_b \gg L_b$ as is schematically shown as laser 2 in FIG. 1(A). The total laser cavity length, $L_{c2}$, is now much larger than that of laser 1. Consequently, the tuning sensitivity $F_\lambda \propto 1/L_{c1}$ becomes smaller and the continuous tuning range is limited to the small FSR of the long laser cavity, as shown illustratively in FIG. 1(B). Nevertheless, laser 2 will exhibit a narrow Schawlow-Townes linewidth as is graphically shown in FIG. 1(C). As we shall show and describe further, our experimental demonstration and description of such a laser having a long cavity will confirm both the narrow Schawlow-Townes linewidth and the small tuning sensitivity $F_\lambda$, when only tuning the phase section.

Note that when a filter is added to the laser cavity, the cavity photon lifetime is significantly increased and the bus waveguide may be kept short, e.g., as short as the bus waveguide of illustrative laser 1. Such a laser including an optical filter is schematically shown as laser 3 in FIG. 1(A).

As will be readily appreciated by those skilled in the art, filters that enhance photon cavity lifetime are typically resonator based and rely on light circulating multiple times within the resonator per roundtrip through the laser cavity. The multiple passes through the resonator effectively extend the cavity length, $L_{c3}$ to beyond the physical mirror spacing, as is schematically indicated by dashed mirrors in the figure. Maximizing the contribution of the optical filter to the cavity photon lifetime ensures that the laser provides single-frequency oscillation with a narrow Schawlow-Townes linewidth. Moreover, as we shall show and describe, the tuning sensitivity $F_\lambda$ of laser 3 can be increased to that of laser 1—for the case of mode-hop-free tuning, which relies on synchronous tuning of the phase section with the resonant filter (see FIG. 1(B)). This mode-hop-free tuning in combination with the increased $F_\lambda$—according to aspects of the present disclosure—advantageously allows the continuous tuning range to extend far beyond the free-spectral range of the laser cavity.

More particularly, for a configuration having a filter based on two microring resonators as employed in our illustrative configurations herein, mode-hop-free tuning requires phase shifters in both rings to keep the resonant wavelength of the rings in synchronization with the oscillating wavelength of the laser. Under this condition, the tuning sensitivity $F_\lambda$ is given by the following relationship (see Appendix for derivation):

$$F_\lambda \equiv \frac{\partial \lambda_c}{\partial \phi_{ps}} = \frac{1}{\pi} \frac{\lambda_c^2}{2n_{g,a}L_a + 2n_{g,b}L_b}, \quad (1)$$

Note that in Eq. 1, $\lambda_c$ is the lasing wavelength, $n_{g,a}$ and $L_a$ are the effective group index of the waveguide in the optical amplifier and its length, respectively, and $n_{g,b}$ and $L_a$ are the according quantities for the silicon nitride bus waveguide.

As will now be readily understood and appreciated by those skilled in the art, Equation 1 summarizes a central finding of laser systems, methods, and structures according to aspects of the present disclosure namely, the tuning sensitivity $F_\lambda$ is independent of the optical or physical length of microring resonators that extend the overall cavity length and is therefore valid for any number of ring resonators. As such, laser systems, methods and structures according to aspects of the present disclosure may surprisingly extend their laser cavity length to large values—exhibiting numerous roundtrips through multiple ring resonators—while reduce the laser linewidth, without reducing the tuning sensitivity $F_\lambda$ when the integrated laser is mode-hop-free tuned.

Figure 2:
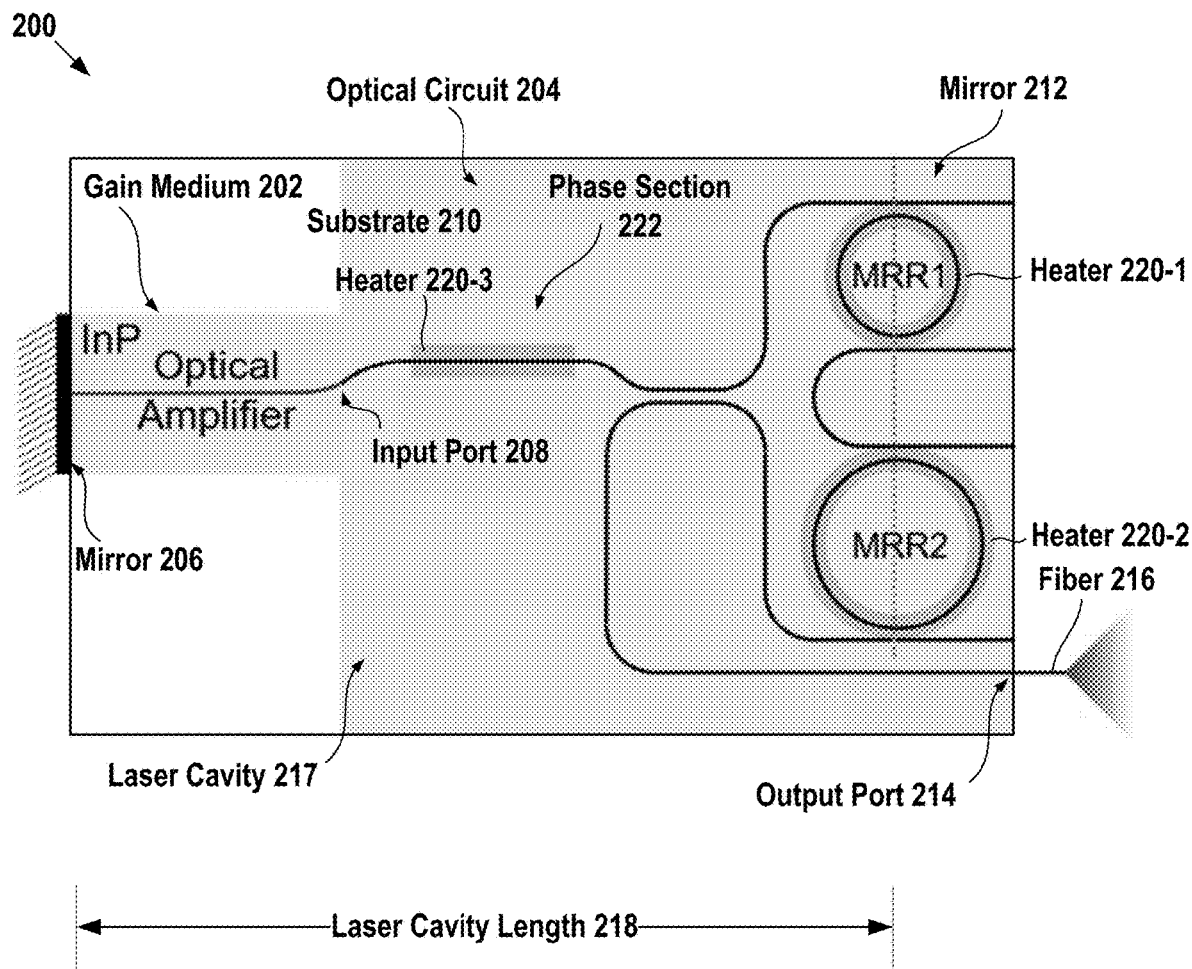
FIG. 2 depicts a schematic drawing of an illustrative embodiment of a tunable laser in accordance with aspects of the present disclosure.

We now turn to FIG. 2 which depicts a schematic drawing of an illustrative embodiment of a tunable laser structure according to aspects of the present disclosure. As depicted, laser 200 includes gain medium 202 and optical circuit 204, which are optically coupled such that they collectively define an external-cavity laser configuration.

As will be appreciated by those skilled in the art, gain medium 202 may be a conventional gain element suitable for providing optical gain for a light signal. In the depicted illustrative example, gain medium 202 is a slab of indium phosphide (InP) that is configured to define a semiconductor optical amplifier (SOA) having a ~700 μm long channel and a gain bandwidth greater than 100 nm centered at 1550 nm. Gain medium 202 is polished at one facet to define feedback mirror 206, which includes a high-reflectivity (HR) coating having a reflectivity of approximately 90%. In alternative illustrative embodiments, the high-reflectivity facet of gain medium 202 is cleaved, rather than polished, prior to being coated with an HR coating. The opposite facet of gain medium 202 is coated with an anti-reflection coating configured to mitigate coupling loss between the gain medium and input port 208 of optical circuit 204. Typically, input port 208 is angled with respect to the front facet at approximately 9° to mitigate back reflections.

In the illustrative arrangement shown, gain medium 202 is mounted on substrate 210, which may be a glass ($Si_3N_4$/$SiO_2$) chip such that the gain medium is optically coupled with input port 208 of optical circuit 204.

Optical circuit 204 is a planar-lightwave circuit (PLC) comprising a plurality of waveguides arranged to define a low-loss optical circuit having input port 208, mirror 212, and output port 214. In the depicted example, the waveguides of optical circuit 204 are multilayer-core waveguides (commonly referred to as TriPleX Waveguides™), as described in U.S. Pat. Nos. 7,146,087, 7,142,317, 9,020,317, and 9,221,074, each of which is incorporated herein by reference. It should be noted, however, that myriad alternative waveguide structures can be used in optical circuit 204 without departing from the scope of the present disclosure.

In the depicted example, the waveguides of optical circuit 204 have a core that includes a lower core layer comprising silicon nitride, a central core layer comprising silicon dioxide, and an upper core layer comprising silicon nitride. The three core layers are configured such that they collectively support single-mode propagation of a single optical mode. Such a waveguide structure is preferred in some embodiments as it enables low propagation loss over a wide spectral range and can be readily tapered in one or two dimensions to control the shape of the mode field propagating through it, as described in U.S. Pat. No. 9,020,317.

In the depicted example, input port 208 is tapered in two dimensions to match the mode profile of gain medium 202, which is approximately 3.5 microns by 3.5 microns. Furthermore, input port 208 is angled at substantially 19.85° with respect to its facet to match the angle of the opposing facet of gain medium 202 to reduce coupling loss and spurious reflections at the interface. In similar fashion, output port 214 is also tapered to substantially match the mode profile of optical fiber 216.

Each ring resonator RR1 and RR2, is shown as a racetrack resonator such that the pair of ring resonators collectively defines tunable frequency-selective Vernier filter and mirror (referred to herein simply as mirror 212). The frequency-selective reflectivity of mirror 212 defines a single longitudinal mode for laser cavity 217, which is defined by the separation between mirrors 206 and 212. Stated alternatively, laser cavity 217 includes the length of gain medium 202 and the portion of optical circuit 204 between input port 208 and mirror 212. In the depicted example, laser cavity length 218 is several centimeters; therefore, the linewidth of laser 200 is in the 10-kHz-range.

Ring resonators RR1 and RR2 are arranged in an add-drop configuration with slightly different circumferences of substantially 857.5 and 885.1 microns, respectively. Ring resonator RR1 has a free-spectral range (FSR) of 1.58 nm and ring resonator RR2 has an FSR of 1.63 nm. As a result, by virtue of the Vernier effect, the ring resonators have a total FSR of 50.6 nm. The coupling coefficient between the bus waveguides and the racetrack resonators is designed at $\kappa^2=0.1$.

A tunable directional coupler is included within laser cavity 217 to enable extraction of resonating light and direct it toward output port 214. As will be appreciated and understood by those skilled in the art, there are three conditions that collectively determine the wavelength at which laser 200 will oscillate:

i. the wavelength matches the phase condition for constructive interference in a full cavity roundtrip;
ii. the wavelength matches the filtered frequency of both resonators; and
iii. the wavelength is within the gain bandwidth of the material, which depends on the supplied current.

When conditions i, ii, and iii are met, assuming the filter bandwidth if sufficiently sharp, only one cavity mode will reach threshold inversion and laser 100 operates as a single-mode laser.

Ring resonators RR1 and RR2 include heaters 220-1 and 220-2, respectively, which enables wavelength tuning of laser 200. An additional heater, heater 220-3, is disposed on a waveguide of optical circuit 204 within laser cavity 217 to define phase section 222.

Cavity length 218 is controlled in phase section 222 and ring resonators RR1 and RR2, where heaters 220-1 and 220-2 control the optical roundtrip lengths of ring resonators RR1 and RR2. In the depicted example, heaters 220-1, 220-2, and 220-3 (referred to, collectively, as heaters 220) are platinum strips, which can withstand relatively high current flow. In the depicted example, currents of approximately 70 mA were flowed through the heaters, which enabled at least $2\pi$ phase tuning of phase section 222 and nearly $2\pi$ phase tuning of the ring resonators. In some embodiments, higher current flow is used such that at least a $2\pi$ phase tuning is realized in the ring resonators.

In some embodiments, at least one of RR1, RR2, and phase section 222 includes a different phase controller, such as a stress-inducing phase shifter. Non-limiting examples of stress-inducing phase shifters suitable for use in embodiments in accordance with the present disclosure are described in U.S. Pat. Nos. 9,453,791 and 9,764,352 and U.S. Patent Application Publication No. US-2018-0203262-A1, each of which is incorporated herein by reference.

Preferably, gain medium 202 is disposed on a submount that functions as a heatsink. Furthermore, in some embodiments, laser 200 is cooled (e.g., via a thermoelectric cooler, etc.).

In operation, the wavelength of laser 200 depends in a complex way on numerous factors, including the temperature of substrate 210, control of the tunable directional coupler, the drive current through heaters 220, and the like. To simplify the control methodology, substrate temperature and the coupling ratio of the tunable coupler may be fixed, which limits the dependency of the laser wavelength to primarily only the tuning of ring resonators RR1 and RR2 and phase section 222. In some embodiments, substrate temperature is set slightly above room temperature.

Figure 3A:
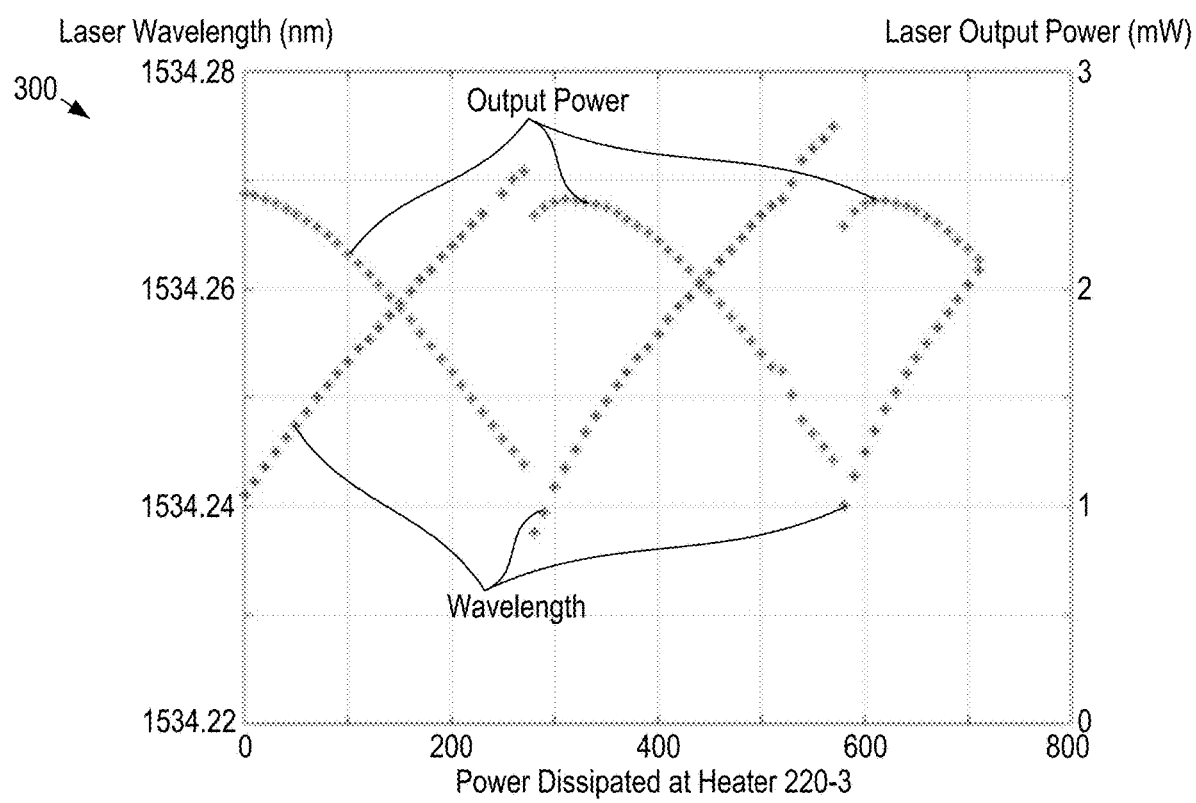
FIG. 3(A) and FIG. 3(B) depict plots of measured laser wavelength for a tunable laser in accordance with aspects of the present disclosure.
Figure 3B:
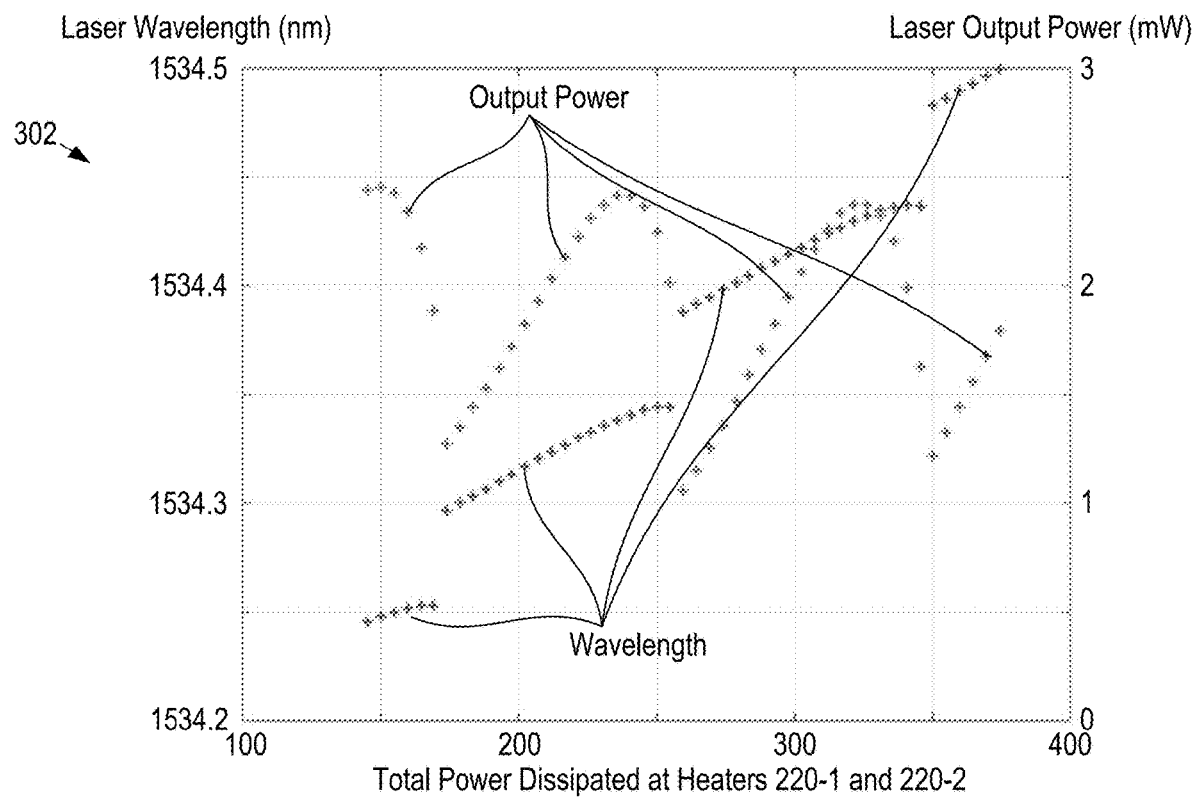

FIG. 3(A) and FIG. 3(B) depict plots of measured laser wavelength for a tunable laser in accordance with the present disclosure. The data shown in plots 300 and 302 was taken while holding substrate temperature at approximately 25° C. and controlling the tunable directional coupler such that its coupling ratio is 0.8, thereby realizing a threshold current for the laser of approximately 14 mA.

Plot 300 shows the relationships between laser wavelength and output power as a function of power dissipation at heater 220-3, while the power dissipation at heaters 220-1 and 220-2 is held constant. The tuning range is limited here to 0.038 nm (4.8 Ghz), which corresponds with the cavity FSR. Plot 300 indicates that laser output power varies during tuning, with discontinuities at mode hops due to changes in the longitudinal mode number. The power required for $\pi$ phase tuning is at $P_{\pi,PS}=292$ mW.

Plot 302 shows the relationships between laser wavelength and output power as a function of power dissipation at heaters 320-1 and 320-2, while the power dissipation at heater 320-3 is held constant.

It is understood that tuning one ring resonator of a Vernier pair will reveal the discrete resonances and thus the FSR of the other ring resonator. Furthermore, as shown by Komljenoic, et al., in "Widely-Tunable Ring-Resonator Semiconductor Lasers," *Appl. Sci.* 7, 732 (2017), which is incorporated herein by reference, the emission wavelength of a laser can be controlled to discrete values within a Vernier FSR by tuning both the ring resonators without adjusting the phase section. The FSR's of ring resonators RR1 and RR2 were determined as 1.55 nm (98.6 Thz) and 1.60 nm (101.8 Thz), respectively, which corresponds with optical pathlengths of 1520 and 1473 microns. The required power for $2\pi$ phase tuning of both ring resonators was determined at $P_{2\pi,RR1}=781$ mW and at $P_{2\pi,RR2}=747$ mW respectively.

In accordance with aspects of the present disclosure, based on these values, a model for mirror 212 is determined to predict the output wavelength of laser 200 as a function of power dissipation at ring resonators RR1 and RR2. This model is then used to enable a continuous scan of wavelength over a given wavelength range, as seen in plot 302.

It should be noted that the power dissipation at both of heaters 220-1 and 220-2 are simultaneously tuned to make such a wavelength scan. Discontinuities in plot 302 arise due to mode hops since ring resonators RR1 and RR2 have a common resonant wavelength that increases when tuning mirror 212 towards longer wavelengths. While the cavity length also increases, its increase is not enough to keep up with the resonance shift. As a result, the laser will hop to a higher longitudinal mode.

It is an aspect of the present disclosure, however, that simultaneously tuning the length of phase section 222 to increase the length of laser cavity 218 can prevent mode hops in the output of laser 200 over a spectral range that exceeds the FSR of the laser cavity 218. Ring resonators RR1 and RR2 function as filter elements within laser cavity 218.

As discussed by Liu, et al., in "Passive microring-resonator-coupled lasers," *Appl. Phys. Lett.* 79, 3561-3563 (2001), the optical round-trip lengths of a ring resonator can contribute to the "effective cavity length" of an integrated-optics-based external-cavity laser. It is another aspect of the present disclosure, therefore, that the mode-hop-free tuning range of laser 200 can be extended beyond the cavity-mode spacing of laser cavity 218 by controlling the optical round-trip lengths of ring resonators RR1 and RR2 while also controlling the length of phase section 222.

It is yet another aspect of the present disclosure that a key to mode-hop-free tuning is finding the ratios between actuating mirror 212 and phase section 222.

Figure 4:
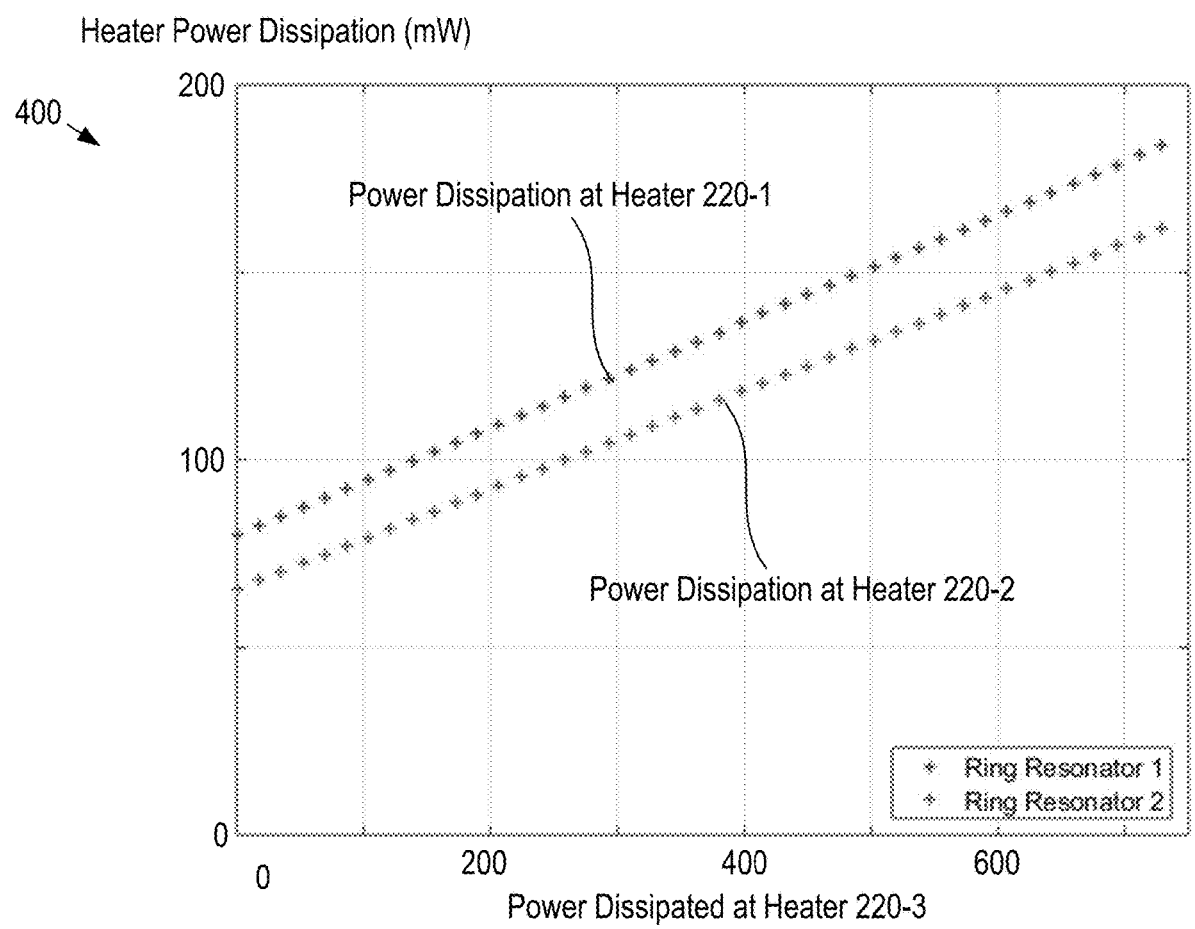
FIG. 4 depicts a plot of calculated actuation ratios between mirror 212 and phase section 122.

FIG. 4 depicts a plot of calculated actuation ratios between mirror 212 and phase section 222.

Figure 5A:
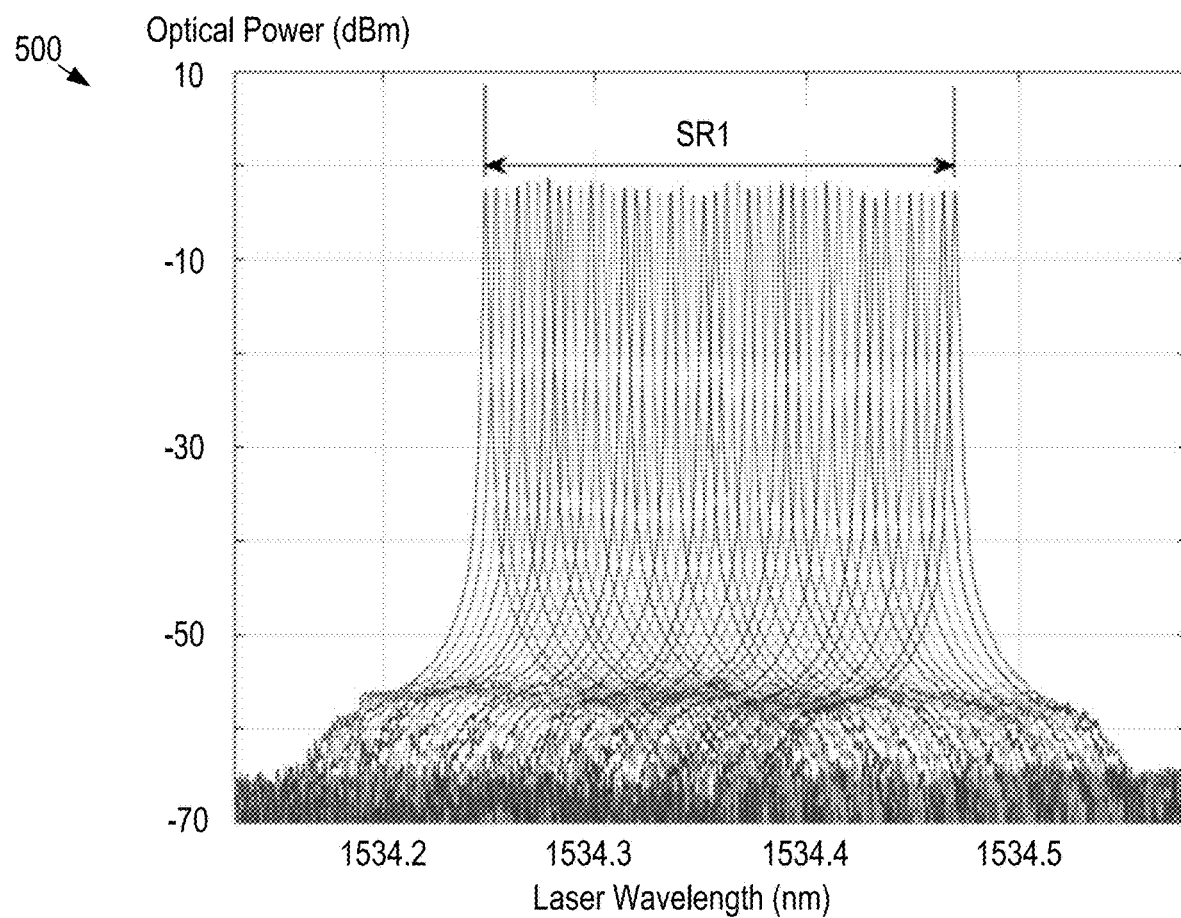
FIG. 5(A), FIG. 5(B), and FIG. 5(C) show measured output spectra, peak wavelengths, and output power, respectively, for laser 200 driven according to actuation ratios shown in plot 400.
Figure 5B:
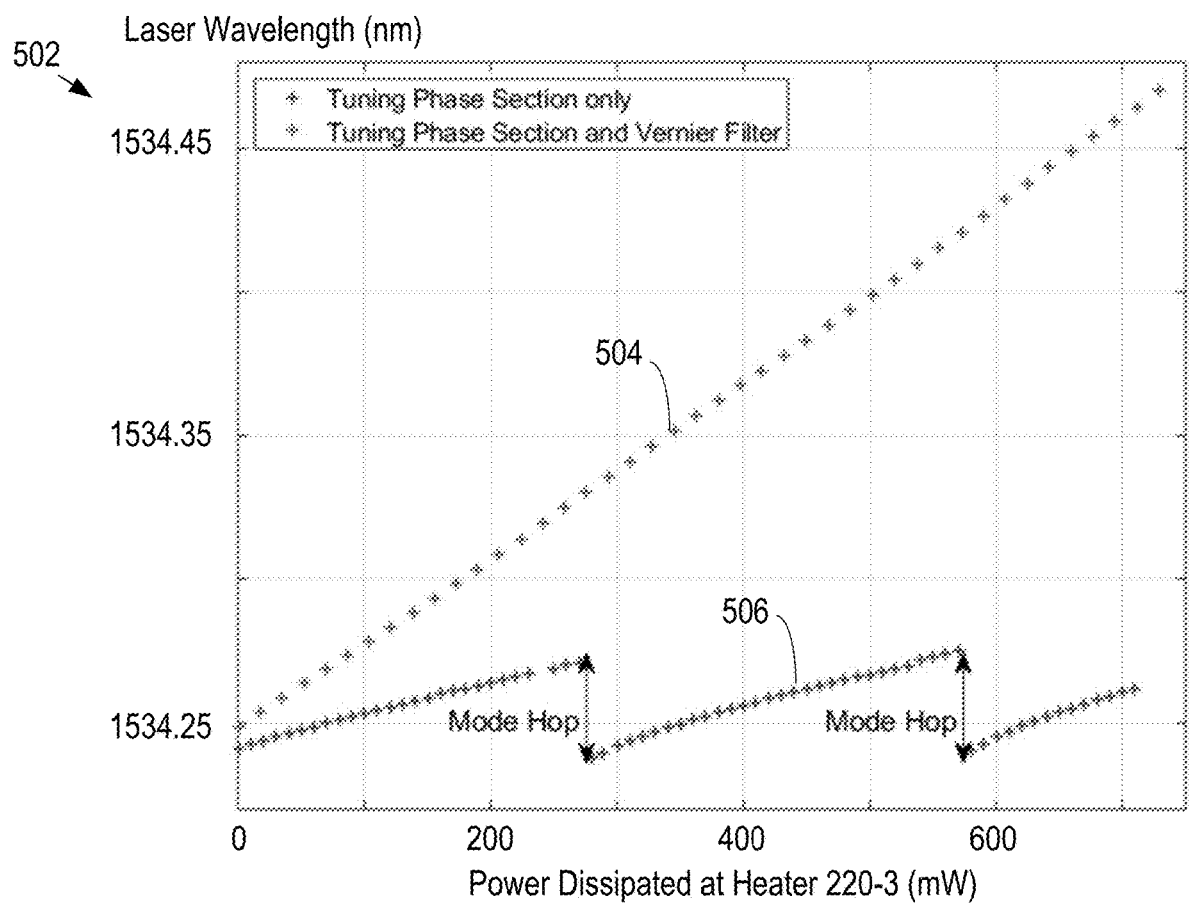
Figure 5C:
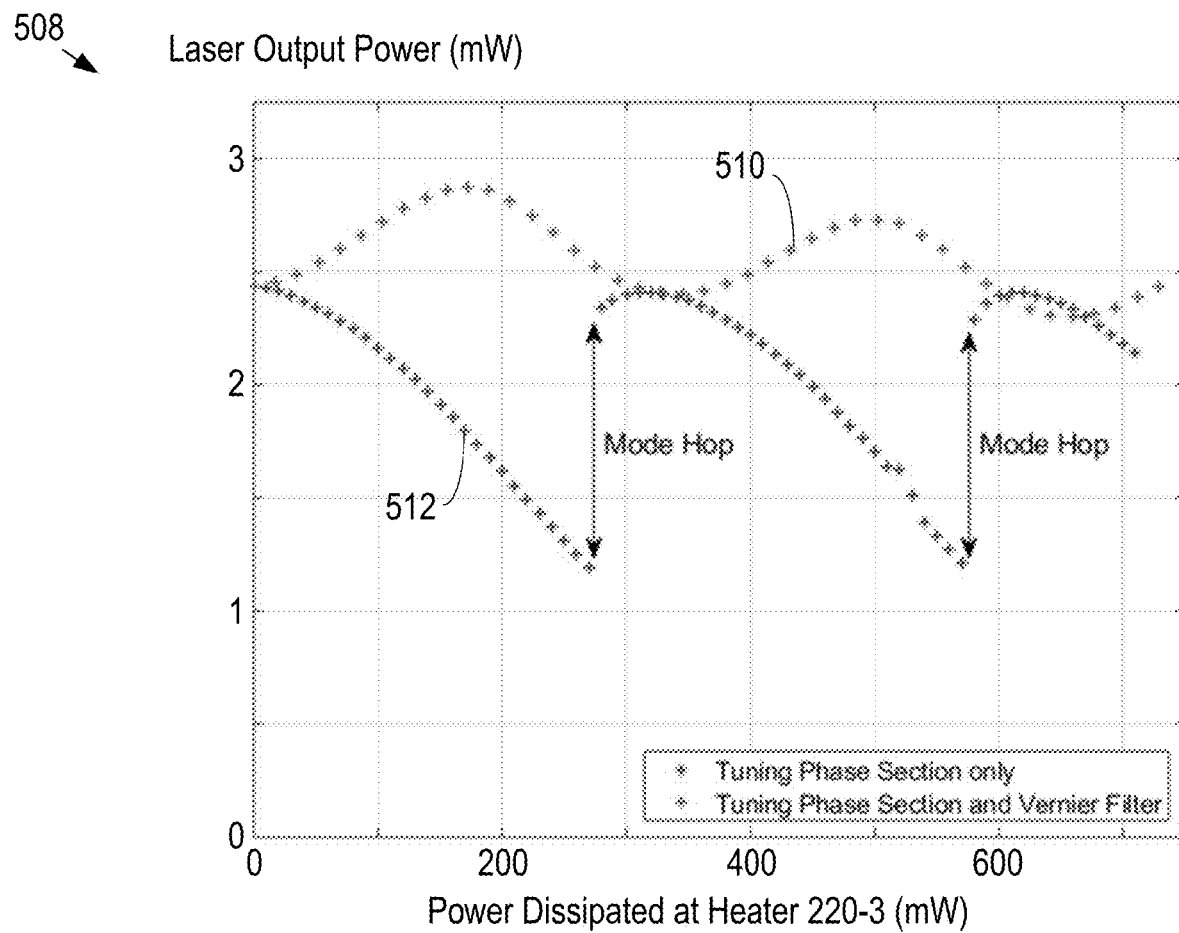

FIG. 5(A), FIG. 5(B), and FIG. 5(C) show measured output spectra, peak wavelengths, and output power, respectively, for laser 200 driven according to actuation ratios shown in plot 400.

Plot 500 shows measured spectra for each actuation ratio shown in plot 400. Plot 500 includes spectral tuning range SR1, which is the spectral range over which mode-hop-free tuning can be realized. In the depicted example, SR1 has a width of approximately 0.22 nm.

Plot 502 includes traces 504 and 506. Trace 504 shows the peak wavelength for each of the spectra in plot 500 for the actuation ratios shown in plot 400. For comparison, trace 506 shows the peak wavelength in the output of laser 200 when only phase section 222 is tuned.

Plot 502 clearly shows that there is a significant difference between tuning only phase section 222 and tuning the phase section simultaneously with the Vernier filter of mirror 212. For a weakly coupled ring ($\kappa$<1) on resonance, the cavity length gets largely extended, so a small change in the optical roundtrip length of the resonator has a large effect on the cavity length. This leverage increases the impact of tuning mirror 212 on the output wavelength when it is done while also tuning phase section 222.

Plot 508 includes traces 510 and 512. Trace 510 shows the peak output power of laser 200 when heaters 220 are controlled with the actuation ratios shown in plot 400. For comparison, trace 512 shows the peak output power of laser 200 when only phase section 222 is tuned.

Furthermore, no discontinuities arise as the laser wavelength and output power are tuned when both mirror 212 and phase section 222 are tuned simultaneously. Plot 508 evinces that range over which the output wavelength of laser 200 can be tuned in mode-hop-free fashion is approximately 0.22 nm (28 Ghz). It should be noted that this spectral range is more than five times the FSR of laser cavity 218.

It should further be noted that the limit on the mode-hop-free tuning range in the depicted example arises from damage that occurs when the power dissipation at heater 222-3 exceeds that which can be sustained by the heater material. By increasing the number of phase section actuators and/or by increasing the actuation effect, the mode-hop-free tuning range can be advantageously increased.

EXPERIMENTAL

Figure 6:
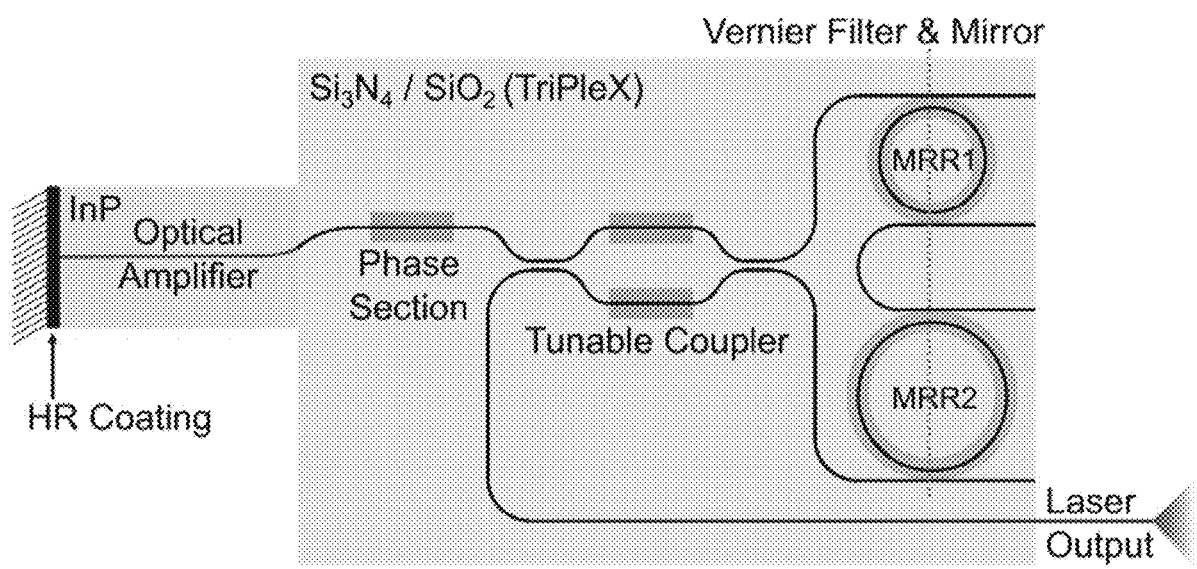
FIG. 6 depicts a schematic drawing of an additional illustrative embodiment of an integrated tunable laser including a tunable coupler in accordance with aspects of the present disclosure.

By way of further experimental demonstration, FIG. 6 depicts a schematic drawing of an illustrative embodiment of a hybrid, integrated InP tunable diode laser constructed according to aspects of the present disclosure. While achieving single-frequency operation, wide wavelength tuning, and narrow linewidth oscillation through cavity length extension, we employ a low-loss $Si_3N_4$ waveguide circuit, which provides frequency-selective feedback. As will be readily appreciated by those skilled in the art, such a structure may advantageously be made via contemporary methods resulting in a small overall physical size.

While not specifically shown, a semiconductor chip depicted in that figure contains a multi-quantum well active waveguide based on InP with a single-pass geometric length of 700 µm and a gain bandwidth of at least 120 nm around 1540 nm. One facet has a high reflectance coating of ~90% against air, which forms one of the mirrors of the laser cavity. At the other facet, light is coupled to a dielectric chip, which forms the other feedback mirror. To reduce undesired reflections at the interface between the two chips, an anti-reflection coating is applied to the facet and the waveguide is tilted by 9° with respect to the facet normal.

Those skilled in the art will appreciate that the dielectric chip provides frequency selective feedback and increases the effective laser cavity length with very low loss. In our experimental configuration, the feedback chip is based on a symmetric double-stripe waveguide geometry of two $Si_3N_4$ stripes buried in a $SiO_2$ cladding. This single-mode waveguide exhibits a low propagation loss of about 0.1 dB/cm and enables small bending radii down to 100 µm. Advantageously, we exploit the two-dimensional tapering capability of the $Si_3N_4$ platform for optimal matching of the optical mode to the mode of the gain chip and to the mode of the output optical fiber. At the facet for coupling with the InP gain chip, the waveguide is tapered two-dimensionally and angled down with 19.85° with respect to the facet normal to match the InP waveguide optical mode and angle at the interface. This mode and angle matching allows efficient coupling and reduces spurious reflections to a minimum.

A frequency selective filter is implemented on the feedback chip using two sequential racetrack-shaped microring resonators, $MRR_1$ and $MRR_2$, in a Vernier configuration and placed inside a loop mirror. The purpose of this filter is to impose single mode operation, tuning over the gain bandwidth and to increase the effective cavity length, which narrows the intrinsic linewidth. As illustratively fabricated, the microrings have a circumference of 885.1 µm and 857.4 µm, respectively. Those skilled in the art will appreciate that such length(s) are the smallest possible, based on the chosen implementation of racetrack resonators with adiabatic bends, the requirement of bend radii of at least 100 µm and the filter specifications. The total free-spectral range of the Vernier filter is 50.5 nm around the nominal wavelength. Although the bandwidth of the InP gain chip is larger, this free-spectral range is sufficient to obtain single mode lasing over a large part of the gain bandwidth. Both rings are symmetric and are designed for a power coupling coefficient to the bus waveguides of $\kappa^2$=0.1.

Note that we determined this value experimentally as $\kappa^2$=0.071±0.003, resulting in a length enhancement by a factor of 13.7 at resonance (cf. Eq. A-6). The length of the connecting bus waveguides and other elements adds up to 6.7 mm. In total this results in an effective optical cavity length of 3.5 cm.

Further, a so-called phase section of the bus waveguide is added to control the phase of the circulating light and to compensate phase changes when tuning any other element. Typically, the phase section is set to provide maximum feedback for a single longitudinal mode of the laser cavity, which restricts laser oscillation to a single wavelength and provides maximum output power. However, the phase section can also be tuned to provide equal feedback for two wavelengths and with this setting the laser can generate a multi-frequency comb.

A tunable coupler, implemented as a balanced Mach-Zehnder interferometer, is used to couple the circulating light out of the laser cavity. The extracted light is directed to a single-mode polarization-maintaining output fiber. To prevent undesired external back reflections, the output fiber is terminated with an FC/APC connector and connected to a fiber isolator (Thorlabs IO-G-1550-APC).

Thermal tuning is implemented via resistive heaters placed above the microrings, the phase section and the output coupler. The length of the phase section and output coupler heaters is 1 mm and both heaters require an electrical power of 290 mW to achieve a π phase shift and can induce a change in the optical phase of at least 2.5π. The slightly shorter heaters on top of the ring resonators require about 380 mW for π phase shift and were tuned up to 1.6π phase shift during the experiments.

The amplifier, feedback chip and output fiber were all aligned for optimum coupling and fixed permanently. This hybrid assembly was mounted on a thermoelectric cooler in a 14-pin butterfly package. The cooler, amplifier and heaters are wire-bonded to the pins and connected to external drivers. This assembly of the hybrid laser enables stable laser operation, which is a prerequisite for accurate and reproducible wavelength tuning.

During the measurements presented here, the laser was operated with the following parameters, unless otherwise specified. The temperature of the thermoelectric cooler was set at 25° C. Although this temperature is slightly above the temperature for maximum performance, it keeps the diode just above ambient temperature to avoid condensation and it reduces the optical output power only with a few percent. Furthermore, the output coupler was set to 80% power outcoupling as this provides the best operating point for single-mode operation with high output power. Finally, after changing a laser parameter, the phase induced by the phase section was optimized for maximum output power, e.g., to compensate for changes in the roundtrip phase when the pump current is changed.

Figure 7:
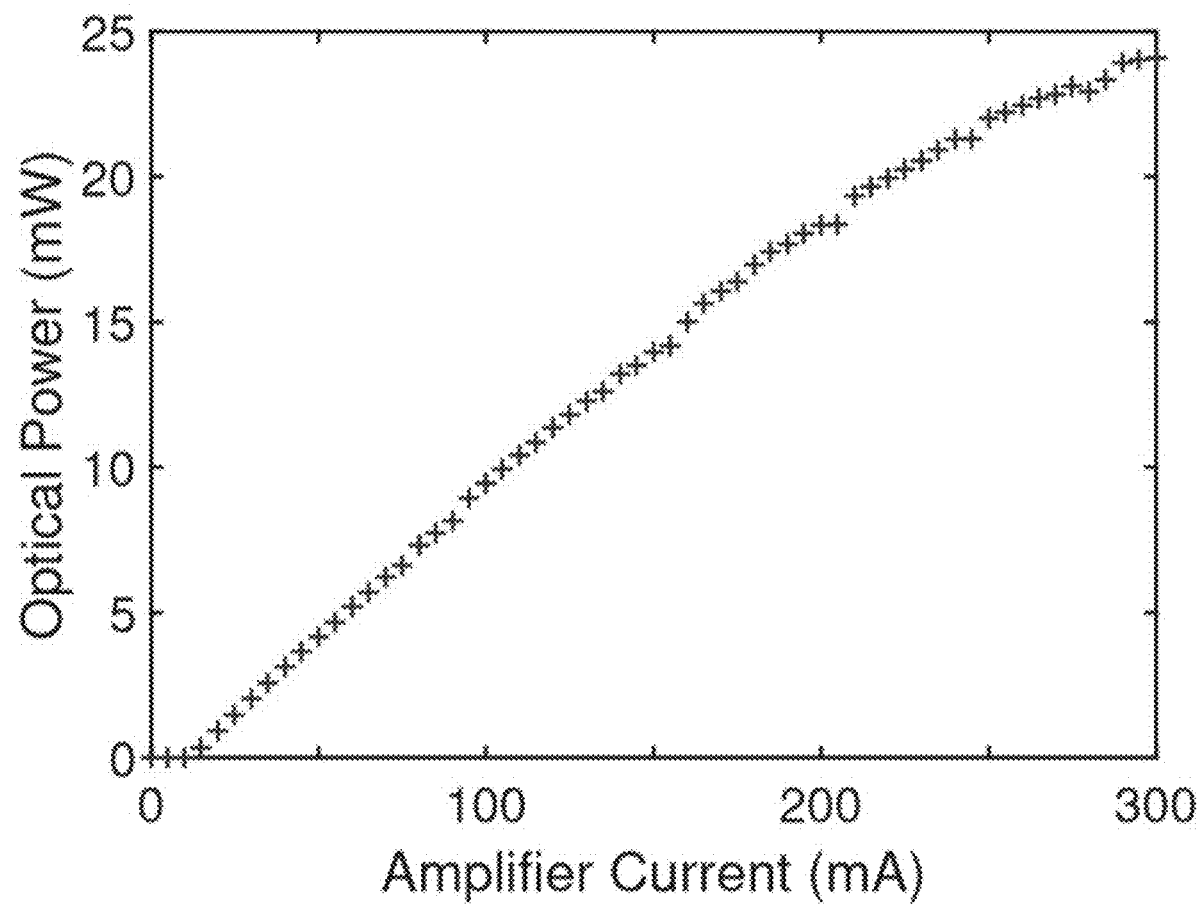
FIG. 7 depicts a plot of measured fiber-coupled output power of the laser as function of amplifier current wherein a thermoelectric cooler was set at 20 C and Vernier filter to a wavelength of 1576 according to aspects of the present disclosure.

The fiber-coupled output power as a function of the pump current is shown in FIG. 7 with the Vernier filter set to a wavelength of 1576 nm and the temperature of the thermoelectric cooler to 20° C., which are near optimum settings for this laser. A maximum of 24 mW was obtained at a pump current of 300 mA and the threshold current was 14 mA.

Figure 8A:
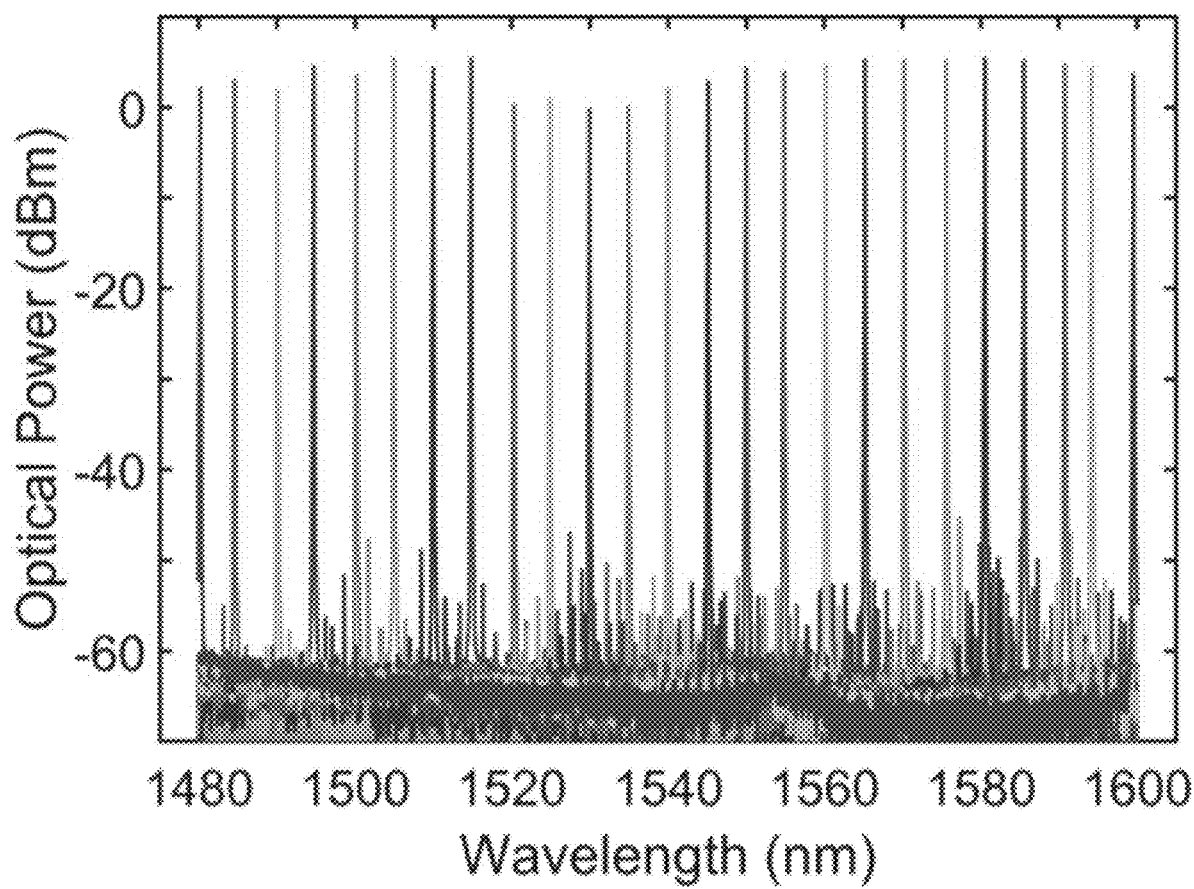

To illustrate the broad spectral coverage of our laser, we show in FIG. 8(A) superimposed laser spectra, as measured with an ANDO AQ6317 optical spectrum analyzer (OSA1), when the Vernier filter is tuned in steps of approximately 5 nm. Pump current was increased to its maximum of 300 mA to obtain the broadest spectral coverage. FIG. 8(A) shows a spectral coverage of 120 nm, i.e., extending the full gain bandwidth of the laser. The spectral coverage larger than the Vernier free-spectral range (~50 nm) was obtained by making use of the spectral dependence of the output coupler that can be varied. Optimum side mode suppression was found for a wavelength of 1550 nm.

Figure 8B:
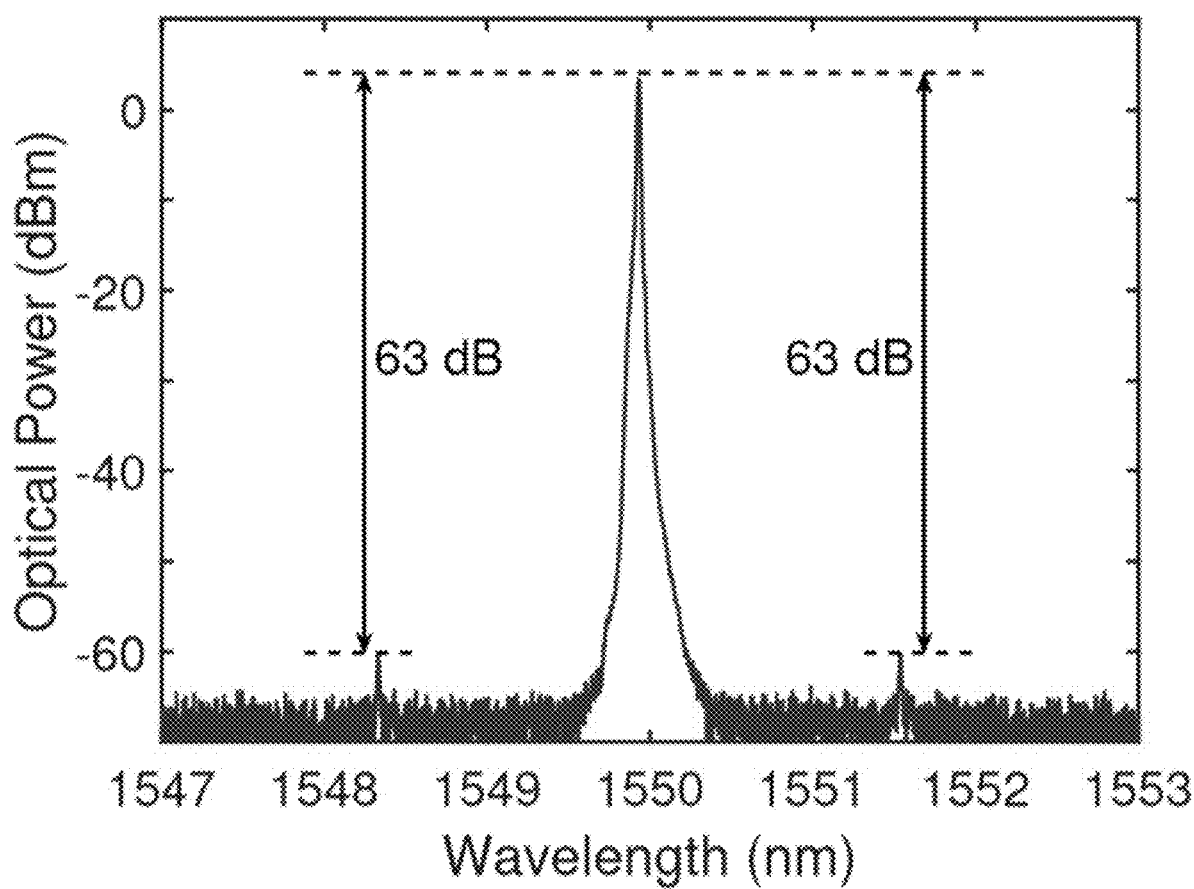

Turning now to FIG. 8(B), there is shown a plot of optical power in a resolution bandwidth of 0.01 nm as a function of wavelength around 1550 nm, averaged over 10 measurements to bring the side modes above the noise level, again measured with OSA1. FIG. 8(B) reveals two side modes with 63 dB suppression that are 1.61 nm away from the main mode, which agrees well with the first side peak of the Vernier filter. We used the high-resolution Finisar WaveAnalyzer 1500S optical spectrum analyzer (OSA2) to verify that only a single cavity mode was present. We expected to find the highest side-mode suppression for wavelengths around 1570 nm, where the output power is maximum. However, with the Vernier filter tuned to that wavelength, another mode at one Vernier free-spectral range away (~50 nm), builds up as well, lowering the side-mode suppression. When the laser is tuned to 1550 nm, modes at ~50 nm distance are not detectable with OSA1, possibly because these modes are suppressed by lower gain or higher losses.

Intrinsic Linewidth and Mode-Hop-Free Tuning

To demonstrate that the effective optical cavity length of 3.5 cm of the hybrid laser according to aspects of the present disclosure results in a high phase stability, we determined the intrinsic linewidth by measuring the power spectral density (PSD) of the frequency noise with a linewidth analyzer (HighFinesse LWA-1k 1550). This analyzer device was connected to the laser via a 10% port of a 90:10 fiber optic coupler. The remaining 90% was distributed over OSA1 and a photodiode. To obtain the lowest white noise level, we applied the maximum pump current of 300 mA from a battery-powered current source (ILX Lightwave LDX-3620) to the gain section. The laser wavelength was set to 1550 nm by the Vernier filter.

Figure 9:
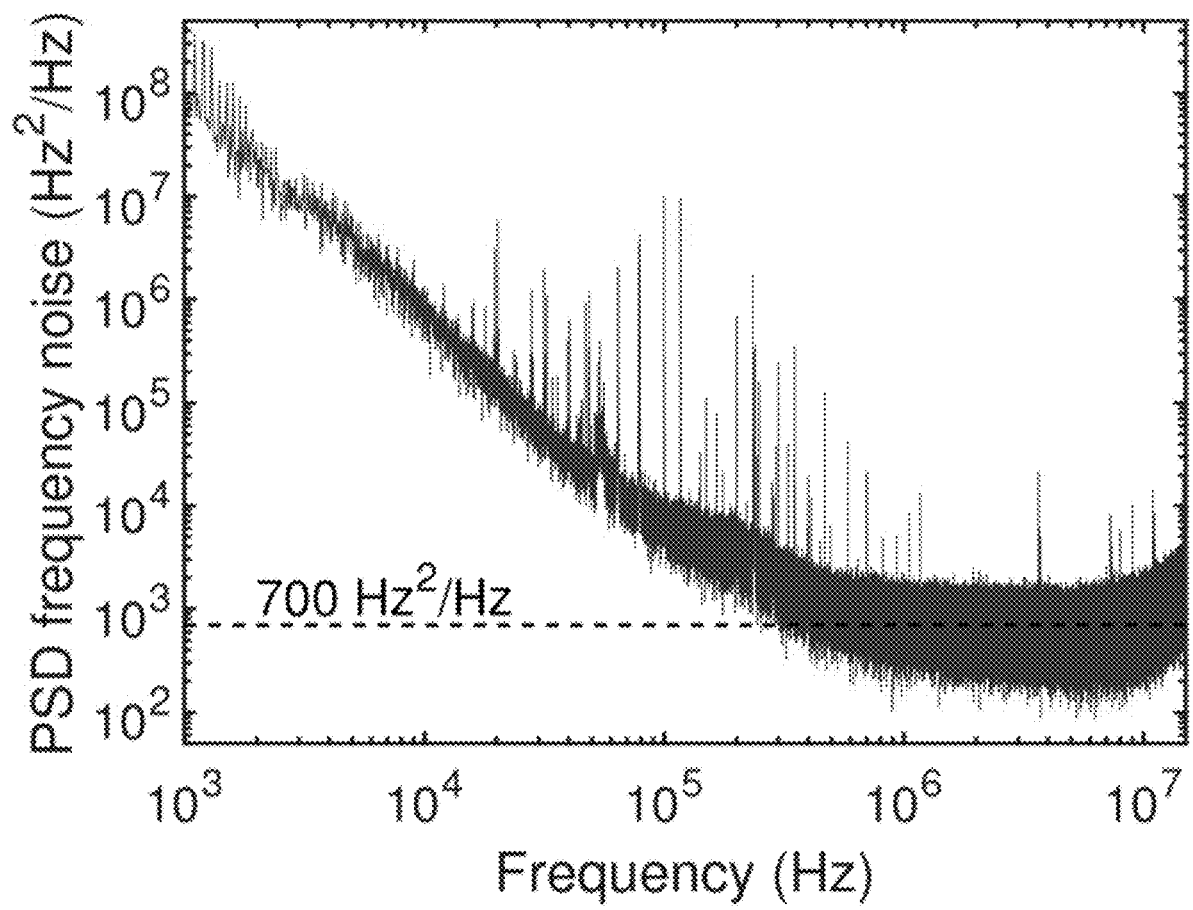
FIG. 9 depicts a plot of measured single-sided power spectral density of the laser frequency noise wherein the dashed line at 700 Hz/Hz indicates average noise for the noise frequency range between 1.3 and 3.5 MHz, excluding any spurious noise frequencies according to aspects of the present disclosure.

FIG. 9 is a plot that shows the measured PSD of the laser frequency noise, as function of the noise frequency. The frequency noise shown in FIG. 9 has the characteristics of 1/f-noise for noise frequencies below approximately 1 MHz and becomes white noise at higher frequencies. The narrow peaks in the spectral power density that can be observed at specific noise frequencies originate likely from either electronic sources or RF-pickup in cables.

The intrinsic linewidth is determined from the average white noise level, excluding spurious peaks, for noise frequencies between 1.3 and 3.5 MHz. Multiplying the single-sided PSD noise level of 700±230 $Hz^2/Hz$ with π results in an intrinsic linewidth of 2.2±0.7 kHz. This value is 4.5 times smaller than previously reported values of 10 kHz for a similar InP—$Si_3N_4$ hybrid laser based on Vernier filters comprising two microring resonators. We attribute this improvement mainly to a 4.6 times higher factor of pump current above threshold current in our measurement.

To verify continuous tuning and the increased mod-hop-free tuning sensitivity of the hybrid laser (see Eq. 1), we measured the laser wavelength and output power as a function of the electrical power applied to heater of the phase section with appropriate heater powers applied to the microring resonators (see Eq. A-11). For these measurements, the laser was connected via a fiber optic coupler to OSA2 to resolve the small stepsize in wavelength and to a photodiode (Thorlabs S144C) to monitor the output power. The amplifier current was set to 70 mA. For zero applied heater power to the phase section, we optimized the ring heaters to align the Vernier filter transmission with the lasing wavelength using minimum heater power. This resulted in an initial wavelength of 1534.25 nm and ensured having the full range of the phase section available for continuous tuning.

For continuous tuning, we experimentally determined the optimum tuning ratios for the phase section versus the ring resonators by maximizing the laser output power as $\partial \varphi_1 / \partial \varphi_{ps} = 0.107$ and $\partial \varphi_2 / \partial \varphi_{ps} = 0.103$ for ring resonators 1 and 2, respectively. This agrees well with the values given by Eq. A-11 of 0.108 and 0.105, respectively, especially when considering the uncertainty in some of the laser parameters. Using these ratios, the heater power for the phase section was increased in steps corresponding to a change in lasing wavelength of 5 pm. The corresponding wavelength and output power are shown as red crosses in FIG. 10(A) and FIG. 10(B), respectively. For comparison, the figure also shows the same measurements when only the heater of the phase section is varied while the heaters for the microrings are kept constant.

Figure 10A:
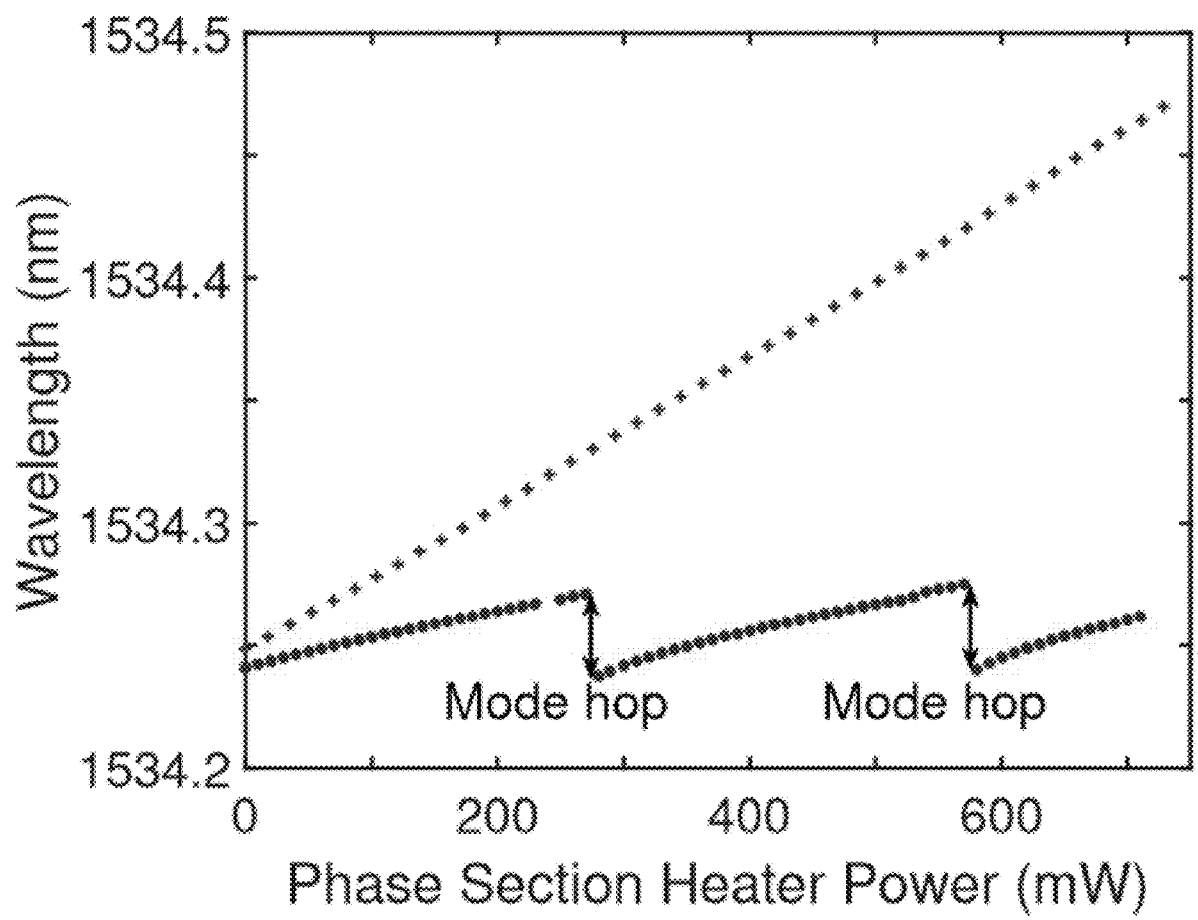
Figure 10B:
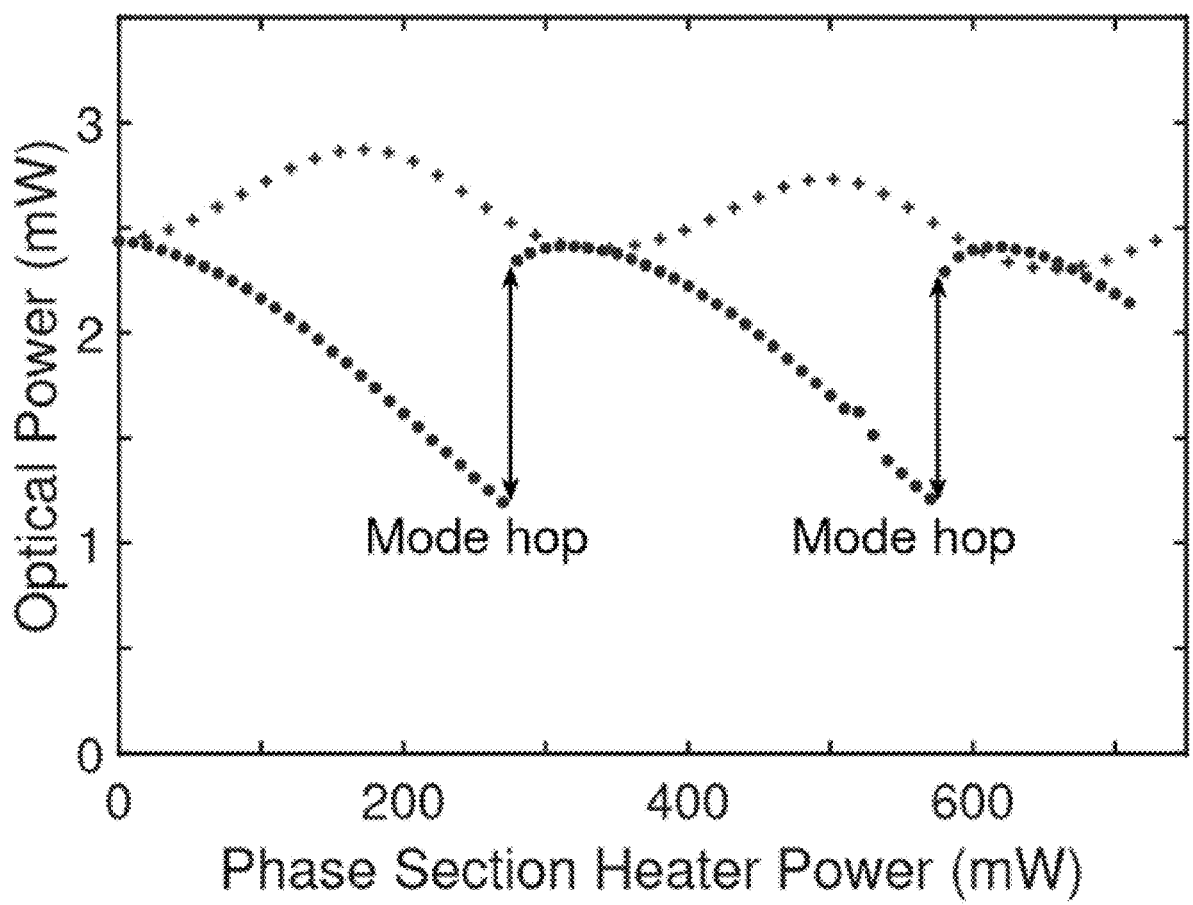

FIG. 10(A) clearly shows that, when only the phase section is tuned, modes hops occur that limit the continuous tuning range to 0.034 nm, which is the free-spectral range of the laser cavity. In this case, the optical cavity length used to calculate the free-spectral range needs to include the effective optical lengths of the microring resonators. Furthermore, the optical power varies strongly and discontinuously during the tuning (see FIG. 10(B)). The reason is that even a small detuning between the lasing wavelength and the fixed position of the sharp Vernier filter transmission peak leads to a strong change in the cavity losses and thus to a change in output power. Further tuning of the phase section, beyond integer multiples of π phase shift, leads to mode hops, which can be observed as discontinuities in the wavelength and output power of the laser.

On the other hand, FIG. 6 shows no mode hops when the resonances of the microring resonators are synchronously tuned with the lasing wavelength via the phase section (red crosses). Although we aimed at constant optical power, there is still some remaining oscillation visible in FIG. 6 (*b*) that corresponds in period with the distance between mode hops. We attribute this to a small changing mismatch between the lasing wavelength and the resonances of the ring resonators during the tuning.

The most apparent difference in FIG. 10(A) is that the tuning sensitivity $\partial \lambda_c / \partial \varphi_{ps}$ is indeed much larger for synchronous tuning compared to only tuning the phase section. We find that $\partial \lambda_c / \partial \varphi_{ps} = 0.31$ pm/mW for synchronous tuning, while it is 0.11 pm/mW when only tuning the phase section. The tuning sensitivity of 0.31 pm/mW agrees well with the value of 0.29 pm/mW predicted by Eq. 1, given the uncertainty in some of the experimentally determined laser parameters. In addition, the synchronous tuning allows for a larger than π phase shift induced by the phase section without invoking a mode hop. These effects together result in a total mode-hop-free tuning range of 0.22 nm, which is a six-fold increase over the free-spectral range of the laser cavity and only limited limit by the available phase shift of the phase section.

Acetylene Absorption Spectroscopy with Mode-Hop-Free Tuning

In demonstrating the continuous tuning of the hybrid laser according to aspects of the present disclosure, we have applied wavelength increments of 5 pm that can easily be resolved using OSA2. However, it should be possible to tune the lasing wavelength in much smaller steps. Current resolution of the electronics used to power the heaters allows mode-hop-free laser wavelength tuning in steps below 0.1 pm, well beyond that what can be resolved by the available optical spectrum analyzers. We demonstrate this small step size by recording the shape of an acetylene absorption line in high resolution. Acetylene ($^{12}C_2H_2$) is chosen because it has several well-known sharp absorption lines in the wavelength range of interest, which can be modelled with high accuracy. For our experimental purposes, we choose the P19 ro-vibrational absorption line of acetylene with a center wavelength of 1536.713 nm.

To measure the acetylene absorption line shape, we divided the laser output into two equal parts through the effect of a fiber optic coupler over two outputs. One part was sent through an absorption cell to a first photodiode (PD1, Thorlabs S144C), while the other part was split again and divided over a second photodiode of the same model (PD2) and OSA1 for calibration of the laser wavelength. The absorption cell employed is a standard sealed fiber-coupled acetylene gas cell from Wavelength Reference Inc., with a 5.5 cm path length and 50 Å5 Torr pressure at 295 K temperature.

The normalized transmission through the absorption cell was determined by dividing the signal of PD1 by the signal of PD2 to compensate for any changes in output power of the laser and then normalize it to the maximum transmission measured in the total tuning range of ~0.23 nm. Using the total tuning range, OSA1 was used to calibrate the increment in wavelength of the laser as 0.12 pm per 0.37 mW heater power applied to the phase section. However, the resolution of the OSA was insufficient to determine an accurate starting wavelength. This starting wavelength was determined by having the center wavelength of the measured P19 absorption line coincide with the value obtained from the calculated transmission. The required offset of −1.8 pm applied to the wavelength of the laser falls well within the resolution of OSA1.

Figure 11:
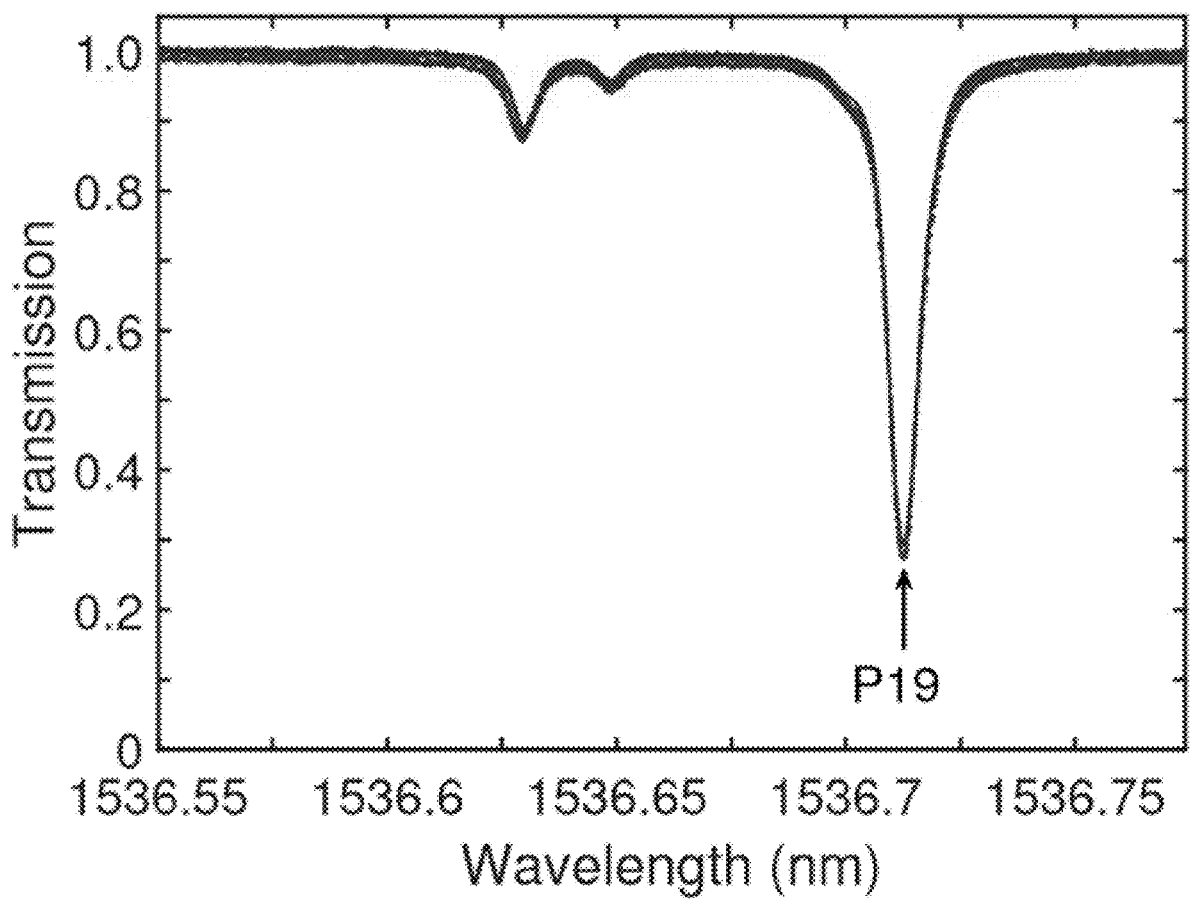
FIG. 11 depicts a plot of measured and calculated transmission through an acetylene gas cell as a function of wavelength for absorption P19 at 1536.713 nm according to aspects of the present disclosure.

FIG. 11 is a plot that shows the measured normalized transmission through the gas cell as function of the calibrated wavelength of the laser (dots). The calculated normalized transmission for nominal pressure corresponding to the temperature of the absorption cell is shown as a blue line. We observe in FIG. 11 an overall good match between the measured and calculated transmission. The slightly broader measured transmission can be explained by the uncertainty in gas cell pressure. By recording the P19 acetylene absorption line and comparing it with an accurately calculated spectrum, we show that, once calibrated, the hybrid extended cavity laser can be accurately tuned to any wavelength within the continuous tuning range of ~0.23 nm (~29 GHz) with a resolution as small as ~0.12 pm (~15 MHz), which is well below the resolution of both optical spectrum analyzers used.

Further Discussion

We have disclosed and described a novel method for increasing the continuous tuning range of integrated single-frequency lasers with an ultra-narrow linewidth by increasing the tuning sensitivity $F_\lambda$. As will be appreciated, such ultra-narrow linewidth is achieved by extending the cavity length with a multi-pass resonator-based filter, as schematically shown as illustrative laser 3 in FIG. 1(A). In our illustrative configurations and experimental configurations, the filter may include two tunable microring resonators—that not only enable single-mode oscillation—but also contribute to the optical length of the laser by providing multiple passes of the light through the rings per roundtrip in the laser cavity. When only tuning the phase section, the laser behaves as laser 2 in FIG. 1(A) and a small tuning sensitivity is found, corresponding to the long external laser cavity. However, when the intracavity filter is synchronously tuned with the phase section, the tuning sensitivity is significantly increased, corresponding to that of an equivalent laser with a short cavity without the effective length of the filter, i.e., to laser 1 in FIG. 1(A).

We have also experimentally demonstrated the extended continuous tuning with a hybrid integrated semiconductor laser. The illustrative laser included a 700 μm long InP gain section, while the effective optical cavity length is extended to 3.5 cm, using a low-loss $Si_3N_4$ waveguide circuit, which narrows the intrinsic linewidth to 2.2 kHz. The circuit comprises a phase section for continuous tuning and a highly frequency selective Vernier filter with two tunable microring resonators. When only tuning the phase section, the tuning range per phase shift, $\partial \lambda_c / \partial \varphi_{ps}$ is only 10 pm/rad. If the Vernier filter frequency is synchronously tuned with the oscillation frequency of the laser, the tuning sensitivity is enhanced by a factor of 2.8, to 28 pm/rad.

This observed enhancement in tuning sensitivity agrees very well with the continuous tuning model we have concurrently developed. This model shows that the enhanced tuning sensitivity relies on the sum of the optical length of the amplifier and the optical length of the bus waveguide. Since the tuning sensitivity is independent of the length of the microring resonators, this allows independent optimization of intrinsic phase stability and continuous tuning sensitivity. Advantageously—for further linewidth narrowing—the cavity length of a laser can be increased without a penalty in the range of continuous tuning, e.g., by increasing the ring diameter, lowering the bus to ring waveguide coupling constants or by adding extra rings. Additionally, the tuning sensitivity and hence the range of continuous tuning can be increased by shortening the length of bus waveguides not used as phase section.

Alternatively, increasing the relative length of the bus waveguides used as phase section extends the continuous tuning range as well. For instance, the continuous tuning range of the laser investigated is limited by the maximum phase delivered by the phase section. If heaters employed were extended to cover all of the available bus waveguides, this would increase the continuous tuning range by a factor of 6.7 to approximately 1.6 nm, while maintaining a 2.2-kHz linewidth. In addition, phase shifters that are more effective than the current 2.5π phase shift per mm length would allow for laser designs with continuous tuning over a much larger range, i.e., beyond 2 nm.

At this point those skilled in the art will readily understand and appreciate that an additional advantage of synchronous phase-and-filter tuning according to aspects of the present disclosure is that it can advantageously mitigate technological limitations in laser wavelength tuning, wavelength modulation, or frequency locking to references. One reason is that the available phase shift of a tunable phase section in integrated photonic circuits is often limited by material constants, e.g., the thermo-optic, strain-optic, or electro-optic coefficients of the involved materials. Our approach disclosed herein increases tuning sensitivity $F_\lambda$, such that less phase shift becomes sufficient for a given tuning range.

As will be appreciated, this is an advantage in many respects, such as to reduce power consumption in thermal phase shifters and to increase the speed in laser tuning and frequency modulation, for facilitating, e.g., spectroscopic and metrologic applications. We note that faster modulation and frequency control is particularly important for stabilizing lasers to reference frequencies, for instance to absolute standards. We have experimentally demonstrated fine-tuning of a laser in steps of 0.12 pm over a full P19 ro-vibrational absorption line of acetylene. Because the recording revealed a known line shape very accurately, we conclude that the laser can be continuously and linearly tuned with steps smaller than the resolution of the available optical spectrum analyzers. Furthermore, such tuning is essential for stabilization of hybrid integrated InP—$Si_3N_4$ lasers to an absolute reference.

Finally, we note that the tuning method according to aspects of the present disclosure based on resonant intracavity filtering can advantageously be applied to other types of lasers as well. Examples of candidate systems include photonic crystal lasers, Bragg waveguides, other gain materials or nonlinear gain. Particular advantages of systems, methods, and structures according to the present disclosure include linewidth narrowing without obstructing continuous tuning, increasing the tuning range without obstructing linewidth narrowing, and reduced power consumption or higher speed in continuous tuning or stabilization of single-frequency lasers.

APPENDIX—MODE-HOP-FREE TUNING

The hybrid laser produces maximum output power when each of the ring resonators has a resonant wavelength $\lambda_i$ (i=1, 2) that coincides with the lasing wavelength $\lambda_c$. Mode-hop-free tuning requires that the shift in each of the wavelengths is the same, i.e., $\delta\lambda_c=\delta\lambda_1=\delta\lambda_2$. Tuning of the resonant wavelengths is realized via resistive heaters positioned sufficiently proximate to (i.e., on top of) the phase section and the microring resonators. Heating the phase section changes only the lasing wavelength, while heating a microring resonator will concurrently change the resonant wavelength of the ring and the lasing wavelength. As we shall show, it is the latter property that causes the mode-hop-free tuning sensitivity, $$\frac{\partial \lambda_c}{\phi_{ps}},$$

of this hybrid laser with resonantly enhanced optical cavity length to be larger than that of a standard semiconductor Fabry-Perot laser of equivalent optical length.

In order to model the action of the heaters, we assume that their sole action is to add a phase, $\varphi_j$, to the light propagating through the waveguide section j below the heating element. As the free-spectral range of a resonator is defined as an increase in roundtrip phase of the light with $2\pi$ it is intuitive and straightforward to show that the change in resonant wavelength, $\lambda_i$, for microring resonator, i, with phase added by the heater on top of the ring, $\varphi_i$, is given by $$\frac{\partial \lambda_i}{\partial \phi_i} = \frac{\Delta \lambda_i}{2\pi}, \quad (A-1)$$

where $\Delta\lambda_i$ is the free-spectral range of ring i. This free-spectral range is given by $$\Delta\lambda_i(\lambda) = \frac{\lambda^2}{n_{g,i}(\lambda)L_i}, \quad (A-2)$$

where $\lambda$ is the wavelength in vacuum, $n_{g,i}$ is the effective group index of the $Si_3N_4$ ring waveguide and $L_i$ is the circumference of the ring resonator. In a similar way, the change of lasing wavelength, $\lambda_c$, with phase added by the phase section, $\varphi_{ps}$, is given by $$\frac{\partial \lambda_c}{\partial \phi_{ps}} = \frac{\Delta \lambda_c}{\pi}, \quad (A-3)$$

as the light passes through the phase section twice per roundtrip. In Eq. A-3, $\Delta\lambda_c$ is the free-spectral range of the laser cavity given by $$\Delta\lambda_c(\lambda) = \frac{\lambda^2}{2n_{g,a}(\lambda)L_a + 2n_{g,b}(\lambda)L_b + \sum_i n_{g,i}(\lambda)L_{e,i}(\lambda)}, \quad (A-4)$$

where $n_{g,j}$ is the effective group velocity of the light in the semiconductor waveguide (j=a), the $Si_3N_4$ bus waveguide (j=b) or the $Si_3N_4$ rings (j=i), $L_i$ is the geometric length of section a or b and $L_{e,i}$ is the effective length of ring i given by $$L_{e,i}(\lambda) = -\frac{1}{2\pi} \frac{\lambda^2}{n_{g,i}(\lambda)} \frac{\partial \theta_i}{\partial \lambda}, \quad \text{(A-5)}$$

with $\theta_i$ the phase added to the light when it propagates through the ring from input to drop port. For a symmetric microring resonator at resonance, $L_{e,i}$ reduces to $$L_{e,i} = L_i \left( \frac{1}{2} + \frac{1-\kappa^2}{\kappa^2} \right), \quad \text{(A-6)}$$

where $\kappa^2$ is the power coupling from the input waveguide to the ring and from the ring to the output waveguide. The effective length is equal to the geometric length $L_i/2$ from input to drop port to which a length is added, equal to the distance travelled by the light in the time it effectively remains within the ring, which corresponds to the maximum attainable effective length of the ring.

The laser wavelength is not only shifted by the phase induced by the phase section (Eq. A-3), but also by the phase induced by the heaters on top of the rings. At resonance, the total phase added to the light in the laser cavity by ring i is just $$\varphi_{c,i} = \frac{L_{e,i}}{L_i} \phi_i,$$

which results in a change in lasing wavelength of $$\frac{\partial \lambda_{c,i}}{\partial \phi_i} = \frac{\Delta \lambda_c}{2\pi} \frac{L_{e,i}}{L_i}. \quad \text{(A-7)}$$

For the total change in lasing wavelength, $\delta \lambda_c$, we then have $$\delta \lambda_c = \frac{\partial \lambda_c}{\partial \phi_{ps}} \delta \phi_{ps} + \sum_i \frac{\partial \lambda_{c,i}}{\partial \phi_i} \delta \phi_i. \quad \text{(A-8)}$$

The mode-hop-free condition $\delta \lambda_c = \delta \lambda_i$ requires that the phase added to the light in the rings is proportional to the phase added by the phase section. Using this and substituting Eqs. A-1, A-2, A-3 and A-7 in Eq. A-8 gives $$\delta \lambda_c = \frac{\Delta \lambda_c}{\pi} \delta \phi_{ps} + \sum_i n_{g,i} L_{e,i} \frac{\Delta \lambda_c}{\lambda_c^2} \delta \lambda_c. \quad \text{(A-9)}$$

Using Eq. A-4 in Eq. A-9 gives the mode-hop-free change in lasing wavelength with phase induced by the phase section, which we have introduced as the tuning sensitivity $F_\lambda$ in the main text, as $$F_\lambda \equiv \frac{\partial \lambda_c}{\partial \phi_{ps}} = \frac{1}{\pi} \frac{\lambda_c^2}{2 n_{g,a} L_a + 2 n_{g,b} L_b}, \quad \text{(A-10)}$$

Equation A-10 shows indeed that the mode-hop-free tuning sensitivity does not include the effective length of the microring resonators that are part of the laser cavity, and the tuning sensitivity corresponds to that of a laser with a short cavity length.

To satisfy the mode-hop-free tuning condition, the phase added by the ring resonator heaters must be set with a fixed ratio to the phase added by phase section heater. Using Eqs. A-1, A-2 and A-10 gives this ratio as $$\frac{\partial \phi_i}{\partial \phi_{ps}} = \frac{n_{g,i} L_i}{n_{g,a} L_a + n_{g,b} L_b}. \quad \text{(A-11)}$$

As the right-hand-side of Eq. A-11 is typically less than 1 for most laser designs, the phase added by the ring resonator heaters is usually less than that by the phase section heater. Consequently, the total continuous tuning range is often limited by the phase section heater.

At this point, while we have presented this disclosure using some specific examples, those skilled in the art will recognize that our teachings are not so limited. Accordingly, this disclosure should be only limited by the scope of the claims attached hereto.

The invention claimed is:

1. An integrated-optics tunable laser including:
a laser cavity having a cavity length and a cavity mode spacing, the laser cavity comprising a gain medium that is optically coupled with an optical circuit that includes a phase section that is within the laser cavity and a ring-resonator mirror configuration that is tunable, wherein the gain medium includes a facet that defines a first mirror of the laser cavity and the ring-resonator mirror configuration defines a second mirror of the laser cavity;
wherein the phase section and the ring-resonator mirror are simultaneously tunable with a ratio to enable a mode-hop-free tuning range that is greater than the free-spectral range of the laser cavity; and
wherein the phase section is operative for inducing a cavity phase shift that gives rise to an enhanced continuous wavelength shift.

2. The integrated-optics tunable laser of claim 1 wherein the enhanced continuous wavelength shift per induced cavity phase shift by the phase section is at least 2 times greater than tuning only the phase section.

3. The integrated-optics tunable laser of claim 1 further comprising a resonator-based filter tuning element that varies the laser cavity length.

4. The integrated-optics tunable laser of claim 3 wherein the laser cavity length increases when resonator rings comprising the resonator-based filter tuning element are tuned.

5. The integrated-optics tunable laser of claim 4 wherein a tuning sensitivity for synchronous tuning is independent of any added effective laser cavity length provided by the ring resonators.

6. A method for operating an integrated-optics tunable laser comprising a laser cavity having a cavity length and a cavity mode spacing, the laser comprising a gain medium that is optically coupled with an optical circuit that includes a phase section that is within the laser cavity and a ring-resonator mirror configuration that is tunable, wherein the gain medium includes a facet that defines a first mirror of the laser cavity and the ring-resonator mirror configuration defines a second mirror of the laser cavity, the method including:
- providing the phase section such that it is operative for inducing a cavity phase shift that gives rise to an enhanced continuous wavelength shift; and
- simultaneously tuning the phase section and the ring-resonator mirror configuration with a ratio that enables a mode-hop-free tuning range that is greater than the free-spectral range of the laser cavity.

7. The method of claim 6 wherein the method further including providing the ring-resonator mirror configuration such that it includes at least two ring resonators that are optically coupled in a Vernier arrangement.

8. The method of claim 6 wherein the method is further including providing the ring-resonator mirror configuration such that it includes at least two ring resonators that are optically coupled in a Vernier arrangement.

9. The method of claim 8 further including increasing the cavity length by tuning at least one ring resonator of the ring-resonator mirror configuration, wherein the tuning sensitivity for synchronous tuning is independent of any added effective laser cavity length provided by the ring resonators.

10. The method of claim 6 further including varying the cavity length by tuning a resonator-based filter tuning element.

* * * * *